US011739243B2

(12) United States Patent
Stewart et al.

(10) Patent No.: US 11,739,243 B2
(45) Date of Patent: Aug. 29, 2023

(54) AZEOTROPE OR AZEOTROPE-LIKE COMPOSITIONS OF 1,2,2-TRIFLUORO-1-TRIFLUOR-METHYL-CYCLOBUTANE (TFMCB) AND APPLICATIONS THEREOF

(71) Applicant: Honeywell International Inc., Charlotte, NC (US)

(72) Inventors: Robert J. Stewart, Buffalo, NY (US); Ryan J. Hulse, Getzille, NY (US)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/381,572

(22) Filed: Jul. 21, 2021

(65) Prior Publication Data
US 2021/0348044 A1 Nov. 11, 2021

Related U.S. Application Data

(62) Division of application No. 16/721,861, filed on Dec. 19, 2019, now abandoned.
(Continued)

(51) Int. Cl.
C09K 5/04 (2006.01)
C08J 9/14 (2006.01)
(Continued)

(52) U.S. Cl.
CPC ............. C09K 5/044 (2013.01); C08J 9/141 (2013.01); C08J 9/145 (2013.01); C08J 9/146 (2013.01);
(Continued)

(58) Field of Classification Search
CPC .......... C09K 5/04; C09K 5/041; C09K 5/044; C09K 5/045; C09K 5/048; C09K 5/10; C09K 2205/108; C09K 2205/12; C09K 2205/122; C09K 2205/124; C09K 2205/128; C09K 2205/22; C09K 2205/24; C09K 2205/32; C08J 9/141; C08J 9/143; C08J 9/144; C08J 9/145; C08J 9/146;
(Continued)

(56) References Cited

U.S. PATENT DOCUMENTS 2,427,116 A 9/1947 Barrick
2,441,128 A 5/1948 Barrick et al.
(Continued)

FOREIGN PATENT DOCUMENTS

CA 2268072 A1 4/1998
CN 108473853 A 8/2018
(Continued)

OTHER PUBLICATIONS

3M(TM) Novec(TM) 1230 SDS (Year: 2017).*
(Continued)

Primary Examiner — Matthew R Diaz
(74) Attorney, Agent, or Firm — Faegre Drinker Biddle & Reath LLP

(57) ABSTRACT

The present disclosure provides minimum-boiling, homogeneous azeotropic and azeotrope-like compositions of 1,2,2-trifluoro-1-trifluoromethylcyclobutane ("TFMCB") with each of ethanol, n-pentane, cyclopentane, trans-1,2-dichloroethylene, and perfluoro(2-methyl-3-pentanone).

10 Claims, 5 Drawing Sheets

Related U.S. Application Data

(60) Provisional application No. 62/784,035, filed on Dec. 21, 2018, provisional application No. 62/784,041, filed on Dec. 21, 2018, provisional application No. 62/784,020, filed on Dec. 21, 2018, provisional application No. 62/784,049, filed on Dec. 21, 2018.

(51) Int. Cl.
*C11D 7/50* (2006.01)
*C11D 17/00* (2006.01)
*C09D 9/00* (2006.01)
*C09K 5/10* (2006.01)
*H05K 7/20* (2006.01)

(52) U.S. Cl.
CPC .............. *C08J 9/149* (2013.01); *C09D 9/005* (2013.01); *C09K 5/045* (2013.01); *C09K 5/048* (2013.01); *C09K 5/10* (2013.01); *C11D 7/5018* (2013.01); *C11D 7/5022* (2013.01); *C11D 7/5054* (2013.01); *C11D 7/5063* (2013.01); *C11D 7/5072* (2013.01); *C11D 17/0043* (2013.01); *H05K 7/2029* (2013.01); *H05K 7/20881* (2013.01); C08J 2203/14 (2013.01); C08J 2203/144 (2013.01); C08J 2203/182 (2013.01); C08J 2325/06 (2013.01); C08J 2375/04 (2013.01); C09K 2205/108 (2013.01); C09K 2205/12 (2013.01); C09K 2205/122 (2013.01); C09K 2205/124 (2013.01); C09K 2205/24 (2013.01); C09K 2205/32 (2013.01)

(58) Field of Classification Search
CPC ............ C08J 9/147; C08J 9/148; C08J 9/149; C08J 2203/14; C08J 2203/142; C08J 2203/144; C08J 2203/182; C09D 9/005; C11D 7/5018; C11D 7/5022; C11D 7/5036; C11D 7/504; C11D 7/5045; C11D 7/505; C11D 7/5054; C11D 7/5059; C11D 7/5063; C11D 17/0043; C07C 23/06; H05K 7/2029; H05K 7/20881

See application file for complete search history.

(56) References Cited

U.S. PATENT DOCUMENTS

| | | |
|---|---|---|
| 2,462,345 A | 2/1949 | Barrick |
| 2,834,748 A | 5/1958 | Bailey et al. |
| 2,846,458 A | 8/1958 | Haluska |
| 2,848,504 A | 8/1958 | Dixon |
| 2,917,480 A | 12/1959 | Bailey et al. |
| 2,931,840 A | 4/1960 | Maley |
| 2,982,786 A | 5/1961 | McCane |
| 3,085,918 A | 4/1963 | Raymond et al. |
| 3,996,299 A | 12/1976 | Fozzard |
| 3,996,301 A | 12/1976 | Fozzard |
| 4,086,407 A | 4/1978 | Fozzard |
| 4,541,943 A | 9/1985 | Powell |
| 5,026,499 A * | 6/1991 | Merchant ............... C09K 5/045 252/364 |
| 5,035,830 A * | 7/1991 | Merchant ............... C09K 5/045 252/364 |
| 5,159,527 A | 10/1992 | Flynn |
| 5,182,342 A | 1/1993 | Feiring et al. |
| 5,194,170 A | 3/1993 | Merchant et al. |
| 5,196,137 A | 3/1993 | Merchant |
| 5,210,106 A | 5/1993 | Dams et al. |
| 5,211,873 A | 5/1993 | Dams et al. |
| 5,221,493 A | 6/1993 | Merchant et al. |
| 5,250,208 A | 10/1993 | Merchant et al. |
| 5,310,870 A | 5/1994 | Peavy |
| 5,434,195 A | 7/1995 | Imeokparia et al. |
| 5,564,447 A | 10/1996 | Niedermair |
| 5,580,906 A | 12/1996 | Merchant et al. |
| 5,759,986 A | 6/1998 | Merchant et al. |
| 5,762,817 A | 6/1998 | Merchant et al. |
| 5,763,703 A | 6/1998 | Nakada et al. |
| 5,897,809 A | 4/1999 | Merchant et al. |
| 5,925,611 A | 7/1999 | Flynn et al. |
| 5,962,390 A | 10/1999 | Flynn et al. |
| 5,977,237 A | 11/1999 | Shin et al. |
| 6,127,430 A | 10/2000 | Baran et al. |
| 6,149,980 A | 11/2000 | Behr et al. |
| 6,159,917 A * | 12/2000 | Baran, Jr ................ D06L 1/04 510/285 |
| 6,291,417 B1 | 9/2001 | Flynn et al. |
| 6,376,452 B1 | 4/2002 | Flynn et al. |
| 6,423,673 B1 * | 7/2002 | Owens .................... C09K 5/00 510/415 |
| 6,509,309 B2 * | 1/2003 | Flynn .................. C11D 7/5018 134/40 |
| 6,516,837 B2 | 2/2003 | Thomas et al. |
| 6,552,090 B1 | 4/2003 | Behr et al. |
| 6,624,337 B1 | 9/2003 | Manzer et al. |
| 6,653,512 B1 * | 11/2003 | Behr ..................... C11D 3/245 564/510 |
| 6,734,154 B2 | 5/2004 | Flynn et al. |
| 6,743,262 B1 | 6/2004 | Behr et al. |
| 6,953,606 B2 | 10/2005 | Behr et al. |
| 7,022,658 B2 | 4/2006 | Hesselroth et al. |
| 7,479,239 B2 * | 1/2009 | Minor ................... C09K 5/045 252/68 |
| 7,674,939 B2 | 3/2010 | Mukhopadhyay et al. |
| 7,763,578 B2 | 7/2010 | Owens et al. |
| 8,058,486 B2 | 11/2011 | Merkel et al. |
| 8,084,653 B2 | 12/2011 | Tung et al. |
| 8,198,491 B2 | 6/2012 | Masatoshi et al. |
| 8,324,436 B2 | 12/2012 | Mukhopadhyay et al. |
| 8,344,191 B2 | 1/2013 | Nose et al. |
| 8,425,795 B2 | 4/2013 | Nappa et al. |
| 8,614,361 B2 | 12/2013 | Suzuki et al. |
| 8,618,340 B2 | 12/2013 | Kopkalli et al. |
| 8,802,743 B2 | 8/2014 | Basu et al. |
| 8,969,500 B2 | 3/2015 | Hintzer et al. |
| 8,975,454 B2 | 3/2015 | Merkel et al. |
| 9,061,957 B2 | 6/2015 | Mukhopadhyay et al. |
| 9,790,151 B2 | 10/2017 | Banavali et al. |
| 9,790,152 B2 | 10/2017 | Sharratt et al. |
| 9,856,193 B2 | 1/2018 | Nair et al. |
| 9,957,428 B2 | 5/2018 | Bulinski et al. |
| 10,005,705 B2 | 6/2018 | Nair et al. |
| 10,020,242 B2 | 7/2018 | Katsumata et al. |
| 10,030,185 B2 | 7/2018 | Bulinski et al. |
| 10,031,481 B2 | 7/2018 | Jaccard et al. |
| 10,071,940 B2 | 9/2018 | Banavali et al. |
| 2003/0166807 A1 | 9/2003 | Harrison et al. |
| 2006/0010872 A1 | 1/2006 | Singh et al. |
| 2006/0243944 A1 | 11/2006 | Minor et al. |
| 2007/0173432 A1 | 7/2007 | Nagase et al. |
| 2007/0289317 A1 | 12/2007 | Minor et al. |
| 2008/0058562 A1 | 3/2008 | Petrov et al. |
| 2009/0099396 A1 | 4/2009 | Mukhopadhyay et al. |
| 2009/0186986 A1 | 7/2009 | Nomura et al. |
| 2010/0102272 A1 | 4/2010 | Basu et al. |
| 2011/0097529 A1 | 4/2011 | Durali et al. |
| 2011/0197604 A1 | 8/2011 | Minor et al. |
| 2012/0043492 A1 | 2/2012 | Williams et al. |
| 2012/0216551 A1 | 8/2012 | Minor et al. |
| 2012/0255316 A1 | 10/2012 | Andre et al. |
| 2013/0292614 A1 | 11/2013 | Tuma et al. |
| 2014/0009887 A1 | 1/2014 | Fayemi et al. |
| 2014/0147480 A1 | 5/2014 | Lu et al. |
| 2014/0179887 A1 | 6/2014 | Lu et al. |
| 2015/0001433 A1 | 1/2015 | Robin et al. |
| 2015/0083979 A1 * | 3/2015 | Costello .................. H01B 3/24 252/571 |
| 2015/0315935 A1 | 11/2015 | Myers et al. |
| 2016/0244651 A1 | 8/2016 | Leck et al. |
| 2016/0312096 A1 * | 10/2016 | Bulinski ............... A62D 1/0057 |
| 2016/0333243 A1 | 11/2016 | Fukushima et al. |
| 2017/0137353 A1 | 5/2017 | Banavali et al. |

(56) References Cited

U.S. PATENT DOCUMENTS

| | | | |
|---|---|---|---|
| 2017/0198186 A1* | 7/2017 | Bulinski | C09K 5/04 |
| 2017/0233316 A1 | 8/2017 | Nair et al. | |
| 2017/0283365 A1* | 10/2017 | Lamanna | C09K 5/048 |
| 2018/0065905 A1 | 3/2018 | Nair et al. | |
| 2018/0141887 A1 | 5/2018 | Bulinski et al. | |
| 2018/0141893 A1 | 5/2018 | Lamanna et al. | |
| 2018/0191038 A1 | 7/2018 | Li et al. | |
| 2018/0201817 A1 | 7/2018 | Close et al. | |
| 2018/0208835 A1 | 7/2018 | Armstrong et al. | |
| 2018/0286530 A1 | 10/2018 | Costello et al. | |
| 2018/0298262 A1 | 10/2018 | Bulinski et al. | |
| 2018/0312478 A1 | 11/2018 | Smith et al. | |
| 2020/0199427 A1 | 6/2020 | Stewart et al. | |
| 2020/0199501 A1 | 6/2020 | Singh et al. | |
| 2020/0205318 A1 | 6/2020 | Hulse et al. | |
| 2020/0231774 A1 | 7/2020 | Singh et al. | |

FOREIGN PATENT DOCUMENTS

| | | | |
|---|---|---|---|
| DE | 19924439 A1 | 11/2000 | |
| EP | 0427533 A2 | 5/1991 | |
| EP | 0545430 A1 | 6/1993 | |
| EP | 0628059 B1 | 9/1996 | |
| EP | 1146956 B1 | 2/2004 | |
| EP | 1189954 B1 | 3/2004 | |
| EP | 1183223 B1 | 4/2005 | |
| EP | 1141468 B1 | 1/2007 | |
| EP | 2972596 B1 | 1/2018 | |
| EP | 2834818 B1 | 6/2018 | |
| IN | 201817017822 | 8/2018 | |
| JP | 05-168810 A | 7/1993 | |
| JP | 05-171188 A | 7/1993 | |
| JP | 05171188 A * | 7/1993 | C11D 3/43 |
| JP | 06-049490 A | 2/1994 | |
| JP | 06-329826 A | 11/1994 | |
| JP | 06-346096 A | 12/1994 | |
| JP | 09-077698 A | 3/1997 | |
| JP | 2012-188359 A | 10/2012 | |
| JP | 2018-148208 A | 9/2018 | |
| KR | 10-2011-0093831 A | 8/2011 | |
| KR | 2018-0071383 A | 6/2018 | |
| KR | 10-2018-0109668 A | 10/2018 | |
| TH | 9689 A | 10/1991 | |
| WO | 93/07201 A2 | 4/1993 | |
| WO | 93/17053 A1 | 9/1993 | |
| WO | 97/22683 A1 | 6/1997 | |
| WO | 99/14175 A1 | 3/1999 | |
| WO | 00/18811 A1 | 4/2000 | |
| WO | 00/35571 A1 | 6/2000 | |
| WO | 00/73360 A1 | 12/2000 | |
| WO | 00/75092 A1 | 12/2000 | |
| WO | 2006/011868 A1 | 2/2006 | |
| WO | 2007/029221 A1 | 3/2007 | |
| WO | 2007/053697 A2 | 5/2007 | |
| WO | 2009/003085 A1 | 12/2008 | |
| WO | 2010/055146 A2 | 5/2010 | |
| WO | 2012/102915 A1 | 8/2012 | |
| WO | 2013/151741 A1 | 10/2013 | |
| WO | 2015/095285 A1 | 6/2015 | |
| WO | 2016/011220 A1 | 1/2016 | |
| WO | 2016/048808 A1 | 3/2016 | |
| WO | 2016/064585 A1 | 4/2016 | |
| WO | 2016/196240 A1 | 12/2016 | |
| WO | 2016/196242 A1 | 12/2016 | |
| WO | 2017/030857 A1 | 2/2017 | |
| WO | 2017/083318 A1 | 5/2017 | |
| WO | 2017/095732 A1 | 6/2017 | |
| WO | 2017/155735 A1 | 9/2017 | |
| WO | 2017/172462 A1 | 10/2017 | |
| WO | 2018/039096 A1 | 3/2018 | |
| WO | 2018/057134 A1 | 3/2018 | |
| WO | 2018/089362 A1 | 5/2018 | |
| WO | 2018/116159 A1 | 6/2018 | |

OTHER PUBLICATIONS 3M (Oct. 2013). "3M Performance Fluid PF-5056 for Rigid Foam Formulations." 3M, Technical Data, Electronics Markets Materials Division, 2 pages, retrieved from <https://multimedia.3m.com/mws/media/244061O/3m-performance-fluid-pf-5056.pdf>.

Andersen, M. P. S., & Nielsen, O. J. (2019). Atmospheric chemistry of a cyclic hydro-fluoro-carbon: kinetics and mechanisms of gas-phase reactions of 1-trifluoromethyl-1,2,2-trifluoro-cyclobutane with Cl atoms, OH radicals, and O3. Phys. Chem. Chem. Phys., 21:1497-1505.

Birchall, Michael J., et al. "Cyclopropane Chemistry. Part HL Thermal Decomposition of Some Halogenopolyfluorocyclopropanes." Journal of the Chemical Society, Perkin Transactions 1: Organic and Bio-Organic Chemistry, 16:1773-1779, 1973.

English language machine translation of Kitamura et al. (JP 05-171188 A) (Year: 1993).

Hauptschein, Murray, et al. "The Thermal Dimerization of Perfluoropropene." Contribution from the Organic Research Department, Pennsalt Chemicals Corp., vol. 80, pp. 842-845, Feb. 20, 1958.

Hodneberg, O., et al. (2013). Global Warming Potentials and Radiative Efficiencies of Halocarbons and Related Compounds: A Comprehensive Review. Reviews of Geophysics, 51, paper No. 2012RG000412, pp. 300-378.

International Search Report and Written Opinion issued in PCT/US2016/061021, dated Jan. 17, 2017, 7 pages.

International Search Report and Written Opinion issued in PCT/US2017/060394, dated Feb. 14, 2018, 11 pages.

International Search Report and Written Opinion received for PCT Patent Application No. PCT/US2019/067587, dated Apr. 13, 2020, 10 pages.

International Search Report and Written Opinion received for PCT Patent Application No. PCT/US2019/067589, dated Apr. 29, 2020, 7 pages.

International Search Report and Written Opinion received for PCT Patent Application No. PCT/US2019/067602, dated Apr. 29, 2020, 14 pages.

International Search Report and Written Opinion received for PCT Patent Application No. PCT/US2019/067623, dated Apr. 29, 2020, 13 pages.

Islam, M. R., Shabani, B., & Rosengarten, G. (2017). Electrical and Thermal Conductivities of 50/50 Water-Ethylene Glycol Based TiO2 Nanofluids to be Used as Coolants in PEM Fuel Cells. Energy Procedia, 110:101-108.

OECD/OCDE (2009). OECD Guideline for the Testing of Chemicals, Acute Inhalation of Chemicals, pp. 1-19 pages.

Placzek, D. W. and Rabinovitch, B.S. "The Thermal Isomerization of Trifluoromethyl—and Trifluoroethylcyclopropane." The Journal of Physical Chemistry, 69(7):2141-2145, Jul. 2015, 1965.

REACH (2016). "B.2. Acute Inhalation Toxicity," section B.2 of the C1 Commission Regulation (EC) No. 440/2008 of May 30, 2008 laying down test methods pursuant to Regulation (EC) No. 1907/2006 of the European Parliament and of the Council on the Registration, Evaluation, Authorisation and Restriction of Chemicals (REACH), pp. 229-247.

Sakaino, Yoshiko. "Structures and Chromotropic Properties of Imadazole Derivatives Produced from 3,6-Bis(4,5-diphenyl-2H-imidazol-2-ylidene)cyclohexa-1,4-diene."J. Chem. Soc. Perkin Trans. I, pp. 1063-1066, 1983.

Solvay Solexis, Via S. Pietro. "2Pi Plus 2Pi Cycloaddition Kinetics of Some Fluoro Olefins and Fluoro Vinyl Ethers." Elsevier, Journal of Fluorine Chemistry, 125:1519-1528, 2004.

Stoiljkovich, D. and Jovanovich, S. "The Mechanism of the High-Pressure Free Radical Polymerization of Ethylene." Journal of Polymer Science: Polymer Chemistry Edition, vol. 19, 741-747, 1981.

* cited by examiner

AZEOTROPE OR AZEOTROPE-LIKE COMPOSITIONS OF 1,2,2-TRIFLUORO-1-TRIFLUOROMETHYL-CYCLOBUTANE (TFMCB) AND APPLICATIONS THEREOF

CROSS-REFERENCE TO RELATED APPLICATION

This application is a divisional application of U.S. patent application Ser. No. 16/721,861, filed Dec. 19, 2019, which claims priority to U.S. Provisional Application Nos. 62/784,020, filed Dec. 21, 2018, 62/784,035, filed Dec. 21, 20192018, 62/784,041, filed Dec. 21, 20192018, and 62/784,049, filed Dec. 21, 20192018, all of which are herein incorporated by reference in their entireties.

FIELD

The present disclosure is related to azeotrope or azeotrope-like compositions and, in particular, to azeotrope or azeotrope-like compositions comprising 1,2,2-trifluoro-1-trifluoromethylcyclobutane and applications for these compositions.

BACKGROUND

Fluorocarbon fluids have properties that are desirable for use as heat transfer media, immersion coolants, liquid or gaseous dielectrics, industrial refrigerants, and other applications. For these applications, the use of single component fluids or azeotrope-like mixtures, i.e., those which do not substantially fractionate on boiling and evaporation, are particularly desirable. Unfortunately, the use of certain hydrofluorocarbons "HFCs" in industrial applications is now believed to contribute to the global warming, and accordingly, have limited their contemporary use. However, the identification of new, environmentally-safe, non-fractionating mixtures comprising HFCs are complicated, due to the fact that azeotrope formation is not readily predictable. Therefore, the industry is continually seeking new HFC-based mixtures that are acceptable and environmentally safer substitutes.

The compound 1,2,2-trifluoro-1-trifluoromethylcyclobutane, also known as TFMCB, is a candidate for heat transfer media, and liquid dielectric applications. Furthermore, certain mixtures involving TFMCB may be suitable for particular applications such as heat transfer fluids, thermal management fluids, refrigerants, and heat transfer compositions.

SUMMARY

It has been found that certain azeotropic and azeotrope-like compositions are formed upon mixing 1,2,2-trifluoro-1-trifluoromethylcyclobutane ("TFMCB") with a second component and, in particular, the present disclosure provides minimum-boiling, homogeneous azeotropic or azeotrope-like compositions consisting essentially of 1,2,2-trifluoro-1-trifluoromethyl cyclobutane with each of ethanol, n-pentane, cyclopentane, trans-1,2-dichloroethylene, or perfluoro (2-methyl-3-pentanone).

The compound 1,2,2-trifluoro-1-trifluoromethylcyclobutane ("TFMCB") has the following chemical structure:

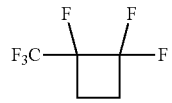 [SMILES: FC(F)(F)C1(F)CCC1(F)F]

1,2,2-trifluoro-1-trifluoromethylcyclobutane ("TFMCB") may also be referred to by alternative names, including 1,2,2-trifluoro-1-trifluoromethyl cyclobutane, 1-trifluoromethyl-1,2,2-trifluorocyclobutane, 1,1,2-trifluoro-2-trifluoromethyl-cyclobutane, or hexafluoropropylene/ethylene cyclic dimer.

TFMCB may be manufactured by any appropriate method. Suitable methods include those set out in U.S. Pat. No. 9,856,193 and U.S. Ser. No. 10/005,705, the entire of which are hereby incorporated by reference.

In one form thereof, the present disclosure provides a composition comprising an azeotrope or azeotrope-like composition consisting essentially of effective amounts of 1,2,2-trifluoro-1-trifluoromethylcyclobutane and trans-1,2-dichloroethylene. The azeotrope or azeotrope-like composition may have a boiling point of about 46.48° C.±0.01° C. at a pressure of about 14.7 psia±0.2 psia.

The azeotrope or azeotrope-like composition may consist essentially of from about 1 wt. % to about 70 wt. % 1,2,2-trifluoro-1-trifluoromethylcyclobutane and from about 30 wt. % to about 99 wt. % trans-1,2-dichloroethylene, from about 10 wt. % to about 50 wt. % 1,2,2-trifluoro-1-trifluoromethylcyclobutane and from about 50 wt. % to about 90 wt. % trans-1,2-dichloroethylene, or from about 15 wt. % to about 40 wt. % 1,2,2-trifluoro-1-trifluoromethylcyclobutane and from about 60 wt. % to about 85 wt. % trans-1,2-dichloroethylene.

In another form thereof, the present disclosure provides a composition comprising an azeotrope or azeotrope-like composition consisting essentially of effective amounts of 1,2,2-trifluoro-1-trifluoromethylcyclobutane and n-pentane. The azeotrope or azeotrope-like composition may have a boiling point of about 35.39° C.±0.01° C. at a pressure of about 14.7 psia±0.2 psia.

The azeotrope or azeotrope-like composition may consist essentially of from about 3 wt. % to about 50 wt. % 1,2,2-trifluoro-1-trifluoromethylcyclobutane and from about 50 wt. % to about 97 wt. % n-pentane, from about 8 wt. % to about 40 wt. % 1,2,2-trifluoro-1-trifluoromethylcyclobutane and from about 60 wt. % to about 92 wt. % n-pentane, or from about 13 wt. % to about 30 wt. % 1,2,2-trifluoro-1-trifluoromethylcyclobutane and from about 70 wt. % to about 87 wt. % n-pentane.

In another form thereof, the present disclosure provides a composition comprising an azeotrope or azeotrope-like composition consisting essentially of effective amounts of 1,2,2-trifluoro-1-trifluoromethylcyclobutane and ethanol. The azeotrope or azeotrope-like composition may have a boiling point of about 66.61° C.±0.01° C. at a pressure of about 14.7 psia±0.2 psia.

The azeotrope or azeotrope-like composition may consist essentially of from about 30 wt. % to about 98 wt. % 1,2,2-trifluoro-1-trifluoromethylcyclobutane and from about 2 wt. % to about 70 wt. % ethanol, from about 70 wt. % to about 96 wt. % 1,2,2-trifluoro-1-trifluoromethylcyclobutane and from about 4 wt. % to about 30 wt. % ethanol, or from about 80 wt. % to about 90 wt. % 1,2,2-trifluoro-1-trifluoromethylcyclobutane and from about 10 wt. % to about 20 wt. % ethanol.

In another form thereof, the present disclosure provides a composition comprising an azeotrope or azeotrope-like composition consisting essentially of effective amounts of 1,2,2-trifluoro-1-trifluoromethylcyclobutane and cyclopentane. The azeotrope or azeotrope-like composition may have a boiling point of about 45.59° C.±0.01° C. at a pressure of about 14.7 psia±0.2 psia.

The azeotrope or azeotrope-like composition may consist essentially of from about 20 wt. % to about 60 wt. % 1,2,2-trifluoro-1-trifluoromethylcyclobutane and from about 40 wt. % to about 80 wt. % cyclopentane, from about 30 wt. % to about 50 wt. % 1,2,2-trifluoro-1-trifluoromethylcyclobutane and from about 50 wt. % to about 70 wt. % cyclopentane, or from about 35 wt. % to about 40 wt. % 1,2,2-trifluoro-1-trifluoromethylcyclobutane and from about 60 wt. % to about 65 wt. % cyclopentane.

In another form thereof, the present disclosure provides a composition comprising an azeotrope or azeotrope-like composition consisting essentially of effective amounts of 1,2,2-trifluoro-1-trifluoromethylcyclobutane and perfluoro(2-methyl-3-pentanone). The azeotrope or azeotrope-like composition has a boiling point of about 48.70° C.±0.01° C. at a pressure of about 14.7 psia±0.2 psia.

The azeotrope or azeotrope-like composition may consist essentially of from about 1 wt. % to about 20 wt. % 1,2,2-trifluoro-1-trifluoromethylcyclobutane and from about 80 wt. % to about 99 wt. % perfluoro(2-methyl-3-pentanone), from about 5 wt. % to about 15 wt. % 1,2,2-trifluoro-1-trifluoromethylcyclobutane and from about 85 wt. % to about 95 wt. % perfluoro(2-methyl-3-pentanone), or from about 8 wt. % to about 12 wt. % 1,2,2-trifluoro-1-trifluoromethylcyclobutane and from about 88 wt. % to about 92 wt. % perfluoro(2-methyl-3-pentanone).

In particular, it is recognized that these compositions tend to exhibit relatively low global warming potentials ("GWPs"), preferably less than about 1000, more preferably less than about 500, and even more preferably less than about 150.

The composition may comprise at least about 15 wt. % of an azeotropic mixture as described herein.

In further aspects, it has been found that certain minimum boiling, homogenous azeotrope compositions are formed upon mixing 1,2,2-trifluoro-1-trifluoromethyl cyclobutane with each of ethanol, n-pentane, cyclopentane, trans-1,2-dichloroethylene, or perfluoro(2-methyl-3-pentanone).

The azeotropic and azeotrope-like mixtures of the disclosure exhibit characteristics which make them particularly desirable for number of applications, including as heat transfer fluids, which may be used, for example, as thermal management fluids in electronic cooling, or as working fluids in Organic Rankine Cycles.

DETAILED DESCRIPTION

Figure 1:
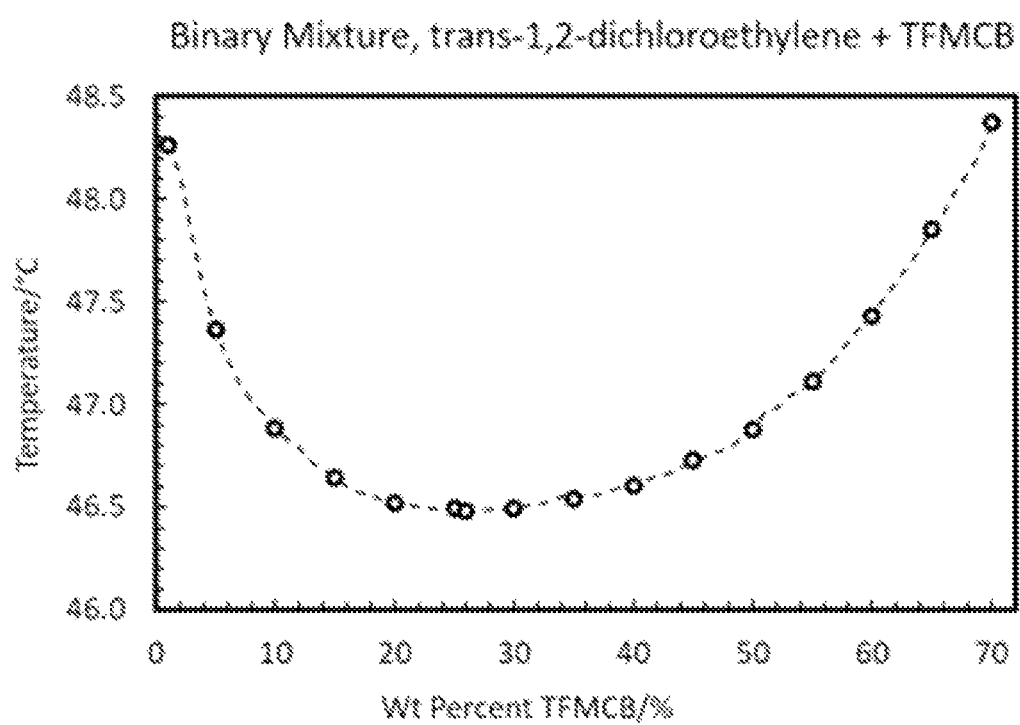
FIG. 1 illustrates the change in boiling point temperature of mixtures of trans-1,2-dichloroethylene and 1,2,2-trifluoro-1-trifluoromethyl cyclobutane at ambient pressure according to Example 1.

I. Description of Azeotrope or Azeotrope-Like Compositions

An "azeotrope" composition is a unique combination of two or more components. An azeotrope composition can be characterized in various ways. For example, at a given pressure, an azeotrope composition boils at a constant characteristic temperature which is either greater than the higher boiling point component (maximum boiling azeotrope) or less than the lower boiling point component (minimum boiling azeotrope). At this characteristic temperature the same composition will exist in both the vapor and liquid phases. The azeotrope composition does not fractionate upon boiling or evaporation. Therefore, the components of the azeotrope composition cannot be separated during a phase change.

An azeotrope composition is also characterized in that at the characteristic azeotrope temperature, the bubble point pressure of the liquid phase is identical to the dew point pressure of the vapor phase.

The behavior of an azeotrope composition is in contrast with that of a non-azeotrope composition in which during boiling or evaporation, the liquid composition changes to a substantial degree.

For the purposes of the present disclosure, an azeotrope composition is characterized as that composition which boils at a constant characteristic temperature, the temperature being lower (a minimum boiling azeotrope) than the boiling points of the two or more components, and thereby having the same composition in both the vapor and liquid phases.

One of ordinary skill in the art would understand however that at different pressures, both the composition and the boiling point of the azeotrope composition will vary to some extent. Therefore, depending on the temperature and/or pressure, an azeotrope composition can have a variable composition. The skilled person would therefore understand that composition ranges, rather than fixed compositions, can be used to define azeotrope compositions. In addition, an azeotrope may be defined in terms of exact weight percentages of each component of the compositions characterized by a fixed boiling point at a specified pressure.

An "azeotrope-like" composition is a composition of two or more components which behaves substantially as an azeotrope composition. Thus, for the purposes of this disclosure, an azeotrope-like composition is a combination of two or more different components which, when in liquid form under given pressure, will boil at a substantially constant temperature, and which will provide a vapor composition substantially identical to the liquid composition undergoing boiling.

Azeotrope or azeotrope-like compositions can be identified using a number of different methods.

For the purposes of this disclosure the azeotrope or azeotrope-like composition is identified experimentally using an ebulliometer (Walas, Phase Equilibria in Chemical Engineering, Butterworth-Heinemann, 1985, 533-544). An ebulliometer is designed to provide extremely accurate measurements of the boiling points of liquids by measuring the temperature of the vapor-liquid equilibrium.

The boiling points of each of the components alone are measured at a constant pressure. As the skilled person will appreciate, for a binary azeotrope or azeotrope-like composition, the boiling point of one of the components of the composition is initially measured. The second component of the composition is then added in varying amounts and the boiling point of each of the obtained compositions is measured using the ebulliometer at said constant pressure.

The measured boiling points are plotted against the composition of the tested composition, for example, for a binary azeotrope, the amount of the second component added to the composition, (expressed as either weight % or mole %). The presence of an azeotrope composition can be identified by the observation of a maximum or minimum boiling temperature which is greater or less than the boiling points of any of the components alone.

As the skilled person will appreciate, the identification of the azeotrope or azeotrope-like composition is made by the comparison of the change in the boiling point of the composition on addition of the second component to the first component, relative to the boiling point of the first component. Thus, it is not necessary that the system be calibrated to the reported boiling point of the particular components in order to measure the change in boiling point.

As used herein, the term "consisting essentially of", with respect to the components of an azeotrope or azeotrope-like composition or mixture, means the composition contains the indicated components in an azeotrope or azeotrope-like ratio, and may contain additional components provided that the additional components do not form new azeotrope or azeotrope-like systems. For example, azeotrope mixtures consisting essentially of two compounds are those that form binary azeotropes, which optionally may include one or more additional components, provided that the additional components do not render the mixture non-azeotropic and do not form an azeotrope with either or both of the compounds (e.g., do not form a ternary or higher azeotrope).

As used herein, the singular forms "a", "an" and "the" include plural unless the context clearly dictates otherwise. Moreover, when an amount, concentration, or other value or parameter is given as either a range, preferred range, or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the disclosure be limited to the specific values recited when defining a range.

As previously discussed, at the maximum or minimum boiling point, the composition of the vapor phase will be identical to the composition of the liquid phase. The azeotrope-like composition is therefore that composition of components which provides a substantially constant minimum or maximum boiling point at which substantially constant boiling point the composition of the vapor phase will be substantially identical to the composition of the liquid phase.

II. Azeotrope or Azeotrope-Like Compositions of 1,2,2-trifluoro-1-trifluoromethylcyclobutane (TFMCB) and trans-1,2-dichloroethylene It has been found that 1,2,2-trifluoro-1-trifluoromethylcyclobutane (TFMCB) forms homogeneous, minimum boiling azeotrope and azeotrope-like compositions or mixtures with trans-1,2-dichloroethylene, and the present disclosure provides homogeneous azeotrope or azeotrope-like compositions comprising 1,2,2-trifluoro-1-trifluoromethylcyclobutane and trans-1,2-dichloroethylene. The azeotrope or azeotrope-like compositions may consist essentially of 1,2,2-trifluoro-1-trifluoromethylcyclobutane and trans-1,2-dichloroethylene, or the azeotrope or azeotrope-like compositions may consist of 1,2,2-trifluoro-1-trifluoromethylcyclobutane and trans-1,2-dichloroethylene.

The present inventors have found experimentally that 1,2,2-trifluoro-1-trifluoromethylcyclobutane and trans-1,2-dichloroethylene form an azeotrope or azeotrope-like composition.

The azeotrope or azeotrope-like composition of 1,2,2-trifluoro-1-trifluoromethylcyclobutane and trans-1,2-dichloroethylene is a binary azeotrope which includes only the foregoing two components, and lacks other components such as alcohols, including methanol and/or ethanol, for example.

The present disclosure provides an azeotrope or azeotrope-like composition which comprises effective amounts of 1,2,2-trifluoro-1-trifluoromethylcyclobutane and trans-1,2-dichloroethylene to form an azeotrope or azeotrope-like composition. As used herein, the term "effective amount" is an amount of each component which, when combined with the other component, results in the formation of an azeotrope or azeotrope-like mixture.

The present azeotrope or azeotrope-like compositions may consist essentially of combinations of 1,2,2-trifluoro-1-trifluoromethylcyclobutane and trans-1,2-dichloroethylene, or consist of combinations of 1,2,2-trifluoro-1-trifluoromethylcyclobutane and trans-1,2-dichloroethylene.

The present disclosure also provides a method of forming an azeotrope or azeotrope-like composition by mixing, combining, or blending, effective amounts of, 1,2,2-trifluoro-1-trifluoromethylcyclobutane and trans-1,2-dichloroethylene. Any of a wide variety of methods known in the art for combining two or more components to form a composition can be used in the present methods. For example, 1,2,2-trifluoro-1-trifluoromethylcyclobutane and trans-1,2-dichloroethylene can be mixed, blended, or otherwise combined by hand and/or by machine, as part of a batch or continuous reaction and/or process, or via combinations of two or more such steps. Both 1,2,2-trifluoro-1-trifluoromethylcyclobutane and trans-1,2-dichloroethylene are commercially available and can be procured from several different vendors. The components can be provided in the required amounts, for example by weighing and then combining the amounts.

Preferably, the azeotrope or azeotrope-like composition comprises, consists essentially of, or consists of, from about 1 wt. % to about 70 wt. % 1,2,2-trifluoro-1-trifluoromethylcyclobutane, from about 10 wt. % to about 50 wt. % 1,2,2-trifluoro-1-trifluoromethylcyclobutane, from about 15 wt. % to about 40 wt. % 1,2,2-trifluoro-1-trifluoromethylcyclobutane, or about 26 wt % 1,2,2-trifluoro-1-trifluoromethylcyclobutane, and from about 30 wt. % to about 99 wt.

% trans-1,2-dichloroethylene, from about 90 wt. % to about 50 wt. % trans-1,2-dichloroethylene, from about 60 wt. % to about 85 wt. % trans-1,2-dichloroethylene, or about 74 wt. % trans-1,2-dichloroethylene. Preferably, the azeotrope or azeotrope-like composition of the present disclosure has a boiling point of about 46.48° C.±0.01° C. at a pressure of about 14.7 psia±0.2 psia.

In other words, the azeotrope or azeotrope-like composition may comprise from about 1 wt. % to about 70 wt. % 1,2,2-trifluoro-1-trifluoromethylcyclobutane and from about 30 wt. % to about 99 wt. % trans-1,2-dichloroethylene, or from about 10 wt. % to about 50 wt. % 1,2,2-trifluoro-1-trifluoromethylcyclobutane and from about 50 wt. % to about 90 wt. % trans-1,2-dichloroethylene, or from about 15 wt. % to about 40 wt. % 1,2,2-trifluoro-1-trifluoromethylcyclobutane and from about 60 wt. % to about 85 wt. % trans-1,2-dichloroethylene, or about 26 wt. % 1,2,2-trifluoro-1-trifluoromethylcyclobutane and about 74 wt. % trans-1,2-dichloroethylene. The azeotrope or azeotrope-like composition may consist essentially of 1,2,2-trifluoro-1-trifluoromethylcyclobutane and trans-1,2-dichloroethylene in the above amounts, or consist of 1,2,2-trifluoro-1-trifluoromethylcyclobutane and trans-1,2-dichloroethylene in the above amounts.

Preferably, the azeotrope or azeotrope-like composition has a boiling point of about 46.48° C.±0.01° C. at a pressure of about 14.7 psia±0.2 psia.

Stated alternatively, the azeotrope or azeotrope-like composition comprises, consists essentially of, or consists of, as little as about 1 wt. %, about 10 wt. % or about 15 wt. %, or as great as about 40 wt. %, about 50 wt. % or about 70 wt. % 1,2,2-trifluoro-1-trifluoromethylcyclobutane, or within any range defined between any two of the foregoing values, and the azeotrope or azeotrope-like composition comprises, consists essentially of, or consists of, as little as about 30 wt. %, about 50 wt. % or about 60 wt. %, or as great as about 85 wt. %, about 90 wt. % or about 99 wt. % trans-1,2-dichloroethylene, or within any range defined between any two of the foregoing values. In one embodiment, the azeotrope or azeotrope-like composition comprises, consists essentially of, or consists of, about 26 wt. % and 1,2,2-trifluoro-1-trifluoromethylcyclobutane and about 74 wt. % of trans-1,2-dichloroethylene. Preferably, the azeotrope or azeotrope-like composition of the present disclosure has a boiling point of about 46.48° C.±0.01° C. at a pressure of about 14.7 psia±0.2 psia.

The present disclosure also provides a composition comprising the azeotrope or azeotrope-like composition. For example, there is provided a composition comprising at least about 5 wt. % of the azeotrope or azeotrope-like composition, or at least about 15 wt. % of the azeotrope or azeotrope-like composition, or at least about 50 wt. % of the azeotrope or azeotrope-like composition, or at least about 70 wt. % of the azeotrope or azeotrope-like composition, or at least about 90 wt. % of the azeotrope or azeotrope-like composition.

The following non-limiting Example serves to illustrate the disclosure.

Example 1—Ebulliometer Study

Boiling point temperature was measured using a comparative ebulliometer including two adjacent flasks fitted with individual, chilled reflux condensers. The top, or reflux condenser, of each ebulliometer was cooled with a circulating, chilled fluid (50/50 water/propylene glycol) to attain a temperature of about 15° C., which is significantly lower than the normal boiling points of 67.8° C. for 1,2,2-trifluoro-1-trifluoromethylcyclobutane and 48.5° C. for trans-1,2-dichloroethylene at a pressure of 14.7 psia. In this manner, it was ensured that all vapors in each flask were condensed and flowed back into each respective boiling flask such that the liquid and vapor phases were in equilibrium. Each flask was equipped with a calibrated thermistor with an accuracy of ±0.01° C. One flask (the "control" flask), contained pure fluid (in this case, either trans-1,2-dichloroethylene or 1,2,2-trifluoro-1-trifluoromethylcyclobutane), and was used as a control. The other flask (the "measurement" flask) contained mixed fluid (in this case, a mixture of trans-1,2-dichloroethylene and 1,2,2-trifluoro-1-trifluoromethylcyclobutane).

The comparative ebulliometer was used to measure the boiling point temperature of pure and mixed fluids at ambient pressure. Approximately 2-3 grams of a first fluid was charged into both the control and the measurement flasks and heated to reflux while stirring. When the temperature of the condensing fluid reached a constant value, the second fluid was added to the measurement flask in measured increments. Sufficient time delay was allowed between additions of the second fluid to achieve proper mixing of the two fluids and thermodynamic equilibration. The second fluid was not added to the control flask. Rather, the control flask was used to confirm constant pressure throughout the duration of the experiment by measuring an invariable boiling point for the pure first fluid.

The measurement was carried out by first introducing about 2 g of trans-1,2-dichloroethylene having a purity of >99 area % as determined by gas chromatography (GC) into the ebulliometer by weighing the container before and after the addition using a balance having an accuracy of ±0.01 g. The liquid was brought to a boil and the equilibrium temperature of the trans-1,2-dichloroethylene was recorded at the recorded barometric pressure. Then, 1,2,2-trifluoro-1-trifluoromethylcyclobutane having a purity of >99.9 area % as determined by gas chromatography (GC) was introduced into the measurement flask in small, measured increments via an automated syringe pump. After a predetermined amount of 1,2,2-trifluoro-1-trifluoromethylcyclobutane was added to the measurement flask, the system was allowed to reach equilibrium for approximately five minutes before the equilibrium temperature of the condensing vapor-liquid mixture was recorded.

Composition versus boiling point data was obtained for the composition range from 1 to 70 weight percent of 1,2,2-trifluoro-1-trifluoromethylcyclobutane and is presented below in Table 1, which shows a minimum in temperature which indicates that an azeotrope had been formed, and this data is also presented in graphic form in FIG. 1. The bubble point temperature of the mixture remained constant indicating that the mixture was azeotrope-like over a large composition range.

A minimum boiling point temperature was observed at 26.0 wt. %±0.3 wt. %1,2,2-trifluoro-1-trifluoromethylcyclobutane in the temperature versus weight percent 1,2,2-trifluoro-1-trifluoromethylcyclobutane curve (FIG. 1), indicating a minimum boiling azeotrope. Select temperature and composition data are shown in Table 1 below.

TABLE 1

Composition TFMCB/trans-1,2-DCE vs Boiling Point Temperature

| % wt. TFMCB | % wt. trans-1,2-DCE | Boiling Point Temperature, ° C. |
|---|---|---|
| 1.0 | 99.0 | 48.26 |
| 5.0 | 95.0 | 47.37 |

TABLE 1-continued

Composition TFMCB/trans-1,2-DCE vs Boiling Point Temperature

| % wt. TFMCB | % wt. trans-1,2-DCE | Boiling Point Temperature, ° C. |
|---|---|---|
| 10.0 | 90.0 | 46.89 |
| 15.0 | 85.0 | 46.64 |
| 20.0 | 80.0 | 46.52 |
| 25.0 | 75.0 | 46.50 |
| 26.0 | 74.0 | 46.48 |
| 30.0 | 70.0 | 46.49 |
| 35.0 | 65.0 | 46.54 |
| 40.0 | 60.0 | 46.60 |
| 45.0 | 55.0 | 46.73 |
| 50.0 | 50.0 | 46.88 |
| 55.0 | 45.0 | 47.11 |
| 60.0 | 40.0 | 47.43 |
| 65.0 | 35.0 | 47.85 |
| 70.0 | 30.0 | 48.37 |

III. Azeotrope or Azeotrope-Like Compositions of 1,2,2-trifluoro-1-trifluoromethylcyclobutane (TFMCB) and n-pentane It has been found that 1,2,2-trifluoro-1-trifluoromethylcyclobutane (TFMCB) forms homogeneous, minimum boiling azeotrope and azeotrope-like compositions or mixtures with n-pentane, and the present disclosure provides homogeneous azeotrope or azeotrope-like compositions comprising 1,2,2-trifluoro-1-trifluoromethylcyclobutane and n-pentane. The azeotrope or azeotrope-like compositions may consist essentially of 1,2,2-trifluoro-1-trifluoromethylcyclobutane and n-pentane, or the azeotrope or azeotrope-like compositions may consist of 1,2,2-trifluoro-1-trifluoromethylcyclobutane and n-pentane.

The present inventors have found experimentally that 1,2,2-trifluoro-1-trifluoromethylcyclobutane and n-pentane form an azeotrope or azeotrope-like composition.

The present disclosure provides an azeotrope or azeotrope-like composition which comprises effective amounts of 1,2,2-trifluoro-1-trifluoromethylcyclobutane and n-pentane to form an azeotrope or azeotrope-like composition. As used herein, the term "effective amount" is an amount of each component which, when combined with the other component, results in the formation of an azeotrope or azeotrope-like mixture.

The present azeotrope or azeotrope-like compositions may consist essentially of combinations of 1,2,2-trifluoro-1-trifluoromethylcyclobutane and n-pentane, or consist of combinations of 1,2,2-trifluoro-1-trifluoromethylcyclobutane and n-pentane.

The present disclosure also provides a method of forming an azeotrope or azeotrope-like composition by mixing, combining, or blending, effective amounts of, 1,2,2-trifluoro-1-trifluoromethylcyclobutane and n-pentane. Any of a wide variety of methods known in the art for combining two or more components to form a composition can be used in the present methods. For example, 1,2,2-trifluoro-1-trifluoromethylcyclobutane and n-pentane can be mixed, blended, or otherwise combined by hand and/or by machine, as part of a batch or continuous reaction and/or process, or via combinations of two or more such steps. Both 1,2,2-trifluoro-1-trifluoromethylcyclobutane and n-pentane are commercially available and can be procured from several different vendors. The components can be provided in the required amounts, for example by weighing and then combining the amounts.

Preferably, the azeotrope or azeotrope-like composition comprises, consists essentially of, or consists of, from about 3 wt. % to about 50 wt. % 1,2,2-trifluoro-1-trifluoromethylcyclobutane, from about 8 wt. % to about 40 wt. % 1,2,2-trifluoro-1-trifluoromethylcyclobutane, from about 13 wt. % to about 30 wt. % 1,2,2-trifluoro-1-trifluoromethylcyclobutane, or about 21 wt. % 1,2,2-trifluoro-1-trifluoromethylcyclobutane, and from about 50 wt. % to about 97 wt. % n-pentane, from about 60 wt. % to about 92 wt. % n-pentane, from about 70 wt. % to about 87 wt. % n-pentane, or about 79 wt. % n-pentane. Preferably, the azeotrope or azeotrope-like composition of the present disclosure has a boiling point of about 35.39° C.±0.01° C. at a pressure of about 14.7 psia±0.2 psia.

In other words, the azeotrope or azeotrope-like composition may comprise from about 3 wt. % to about 50 wt. % 1,2,2-trifluoro-1-trifluoromethylcyclobutane and from about 50 wt. % to about 97 wt. % n-pentane, or from about 8 wt. % to about 40 wt. % 1,2,2-trifluoro-1-trifluoromethylcyclobutane and from about 60 wt. % to about 92 wt. % n-pentane, or from about 13 wt. % to about 30 wt. % 1,2,2-trifluoro-1-trifluoromethylcyclobutane and from about 70 wt. % to about 87 wt. % n-pentane, or about 21 wt. % 1,2,2-trifluoro-1-trifluoromethylcyclobutane and about 79 wt. % n-pentane. The azeotrope or azeotrope-like composition may consist essentially of 1,2,2-trifluoro-1-trifluoromethylcyclobutane and n-pentane in the above amounts, or consist of 1,2,2-trifluoro-1-trifluoromethylcyclobutane and n-pentane in the above amounts.

Preferably, the azeotrope or azeotrope-like composition has a boiling point of about 35.39° C.±0.01° C. at a pressure of about 14.7 psia±0.2 psia.

Stated alternatively, the azeotrope or azeotrope-like composition comprises, consists essentially of, or consists of, as little as about 3 wt. %, about 8 wt. % or about 13 wt. %, or as great as about 30 wt. %, about 40 wt. % or about 50 wt. % 1,2,2-trifluoro-1-trifluoromethylcyclobutane, or within any range defined between any two of the foregoing values, and the azeotrope or azeotrope-like composition comprises, consists essentially of, or consists of, as little as about 50 wt. %, about 60 wt. % or about 70 wt. %, or as great as about 87 wt. %, about 92 wt. % or about 97 wt. % n-pentane, or within any range defined between any two of the foregoing values. In one embodiment, the azeotrope or azeotrope-like composition comprises, consists essentially of, or consists of, about 21 wt. % and 1,2,2-trifluoro-1-trifluoromethylcyclobutane and about 79 wt. % of n-pentane. Preferably, the azeotrope or azeotrope-like composition of the present disclosure has a boiling point of about 35.39° C.±0.01° C. at a pressure of about 14.7 psia±0.2 psia.

The present disclosure also provides a composition comprising the azeotrope or azeotrope-like composition. For example, there is provided a composition comprising at least about 5 wt. % of the azeotrope or azeotrope-like composition, or at least about 15 wt. % of the azeotrope or azeotrope-like composition, or at least about 50 wt. % of the azeotrope or azeotrope-like composition, or at least about 70 wt. % of the azeotrope or azeotrope-like composition, or at least about 90 wt. % of the azeotrope or azeotrope-like composition.

The following non-limiting Example serves to illustrate the disclosure.

Example 2—Ebulliometer Study

The comparative ebulliometer described in Example 1 was used to measure the boiling point temperature of pure and mixed fluids at ambient pressure. Approximately 2-3 grams of a first fluid was charged into both the control and the measurement flasks and heated to reflux while stirring. When the temperature of the condensing fluid reached a constant value, the second fluid was added to the measurement flask in measured increments. Sufficient time delay was allowed between additions of the second fluid to achieve proper mixing of the two fluids and thermodynamic equilibration. The second fluid was not added to the control flask. Rather, the control flask was used to confirm constant pressure throughout the duration of the experiment by measuring an invariable boiling point for the pure first fluid.

The measurement was carried out by first introducing about 2 g of n-pentane having a purity of >99 area % as determined by gas chromatography (GC) into the ebulliometer by weighing the container before and after the addition using a balance having an accuracy of ±0.01 g. The liquid was brought to a boil and the equilibrium temperature of the n-pentane was recorded at the recorded barometric pressure. Then, 1,2,2-trifluoro-1-trifluoromethylcyclobutane having a purity of >99.9 area % as determined by gas chromatography (GC) was introduced into the measurement flask in small, measured increments via an automated syringe pump. After a predetermined amount of 1,2,2-trifluoro-1-trifluoromethylcyclobutane was added to the measurement flask, the system was allowed to reach equilibrium for approximately five minutes before the equilibrium temperature of the condensing vapor-liquid mixture was recorded.

Figure 2:
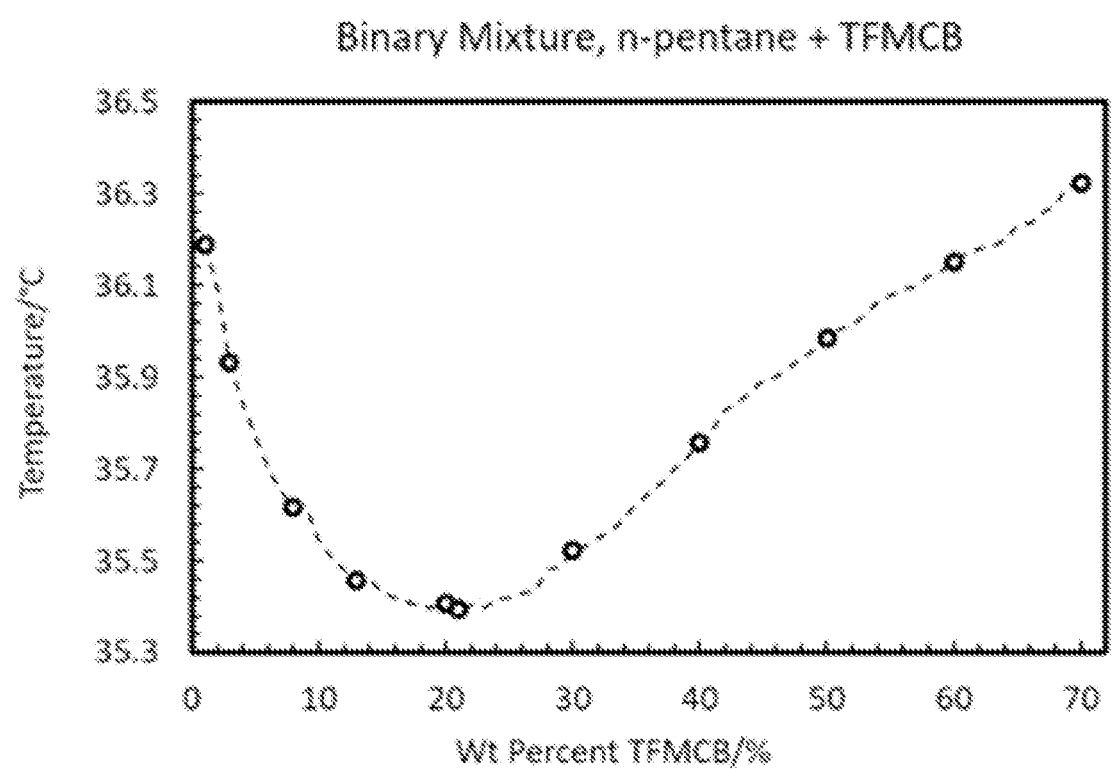
FIG. 2 illustrates the change in boiling point temperature of mixtures of n-pentane and 1,2,2-trifluoro-1-trifluoromethyl cyclobutane at ambient pressure according to Example 2.

Composition versus boiling point data was obtained for the composition range from 0 to 70 weight percent of 1,2,2-trifluoro-1-trifluoromethylcyclobutane and is presented below in Table 2, which shows a minimum in temperature which indicates that an azeotrope had been formed, and this data is also presented in graphic form in FIG. 2. The bubble point temperature of the mixture remained constant indicating that the mixture was azeotrope-like over a large composition range.

A minimum boiling point temperature was observed at 21.0 wt. %±0.3 wt. % 1,2,2-trifluoro-1-trifluoromethylcyclobutane in the temperature versus weight percent 1,2,2-trifluoro-1-trifluoromethylcyclobutane curve (FIG. 2), indicating a minimum boiling azeotrope. Select temperature and composition data are shown in Table 2 below.

TABLE 2

Composition TFMCB/n-pentane vs Boiling Point Temperature

| % wt. TFMCB | % wt. n-pentane | Boiling Point Temperature, ° C. |
| --- | --- | --- |
| 1.0 | 99.0 | 36.19 |
| 3.0 | 97.0 | 35.93 |
| 8.0 | 92.0 | 35.62 |
| 13.0 | 87.0 | 35.46 |
| 20.0 | 80.0 | 35.41 |
| 21.0 | 79.0 | 35.39 |
| 30.0 | 70.0 | 35.52 |
| 40.0 | 60.0 | 35.76 |
| 50.0 | 50.0 | 35.98 |
| 60.0 | 40.0 | 36.15 |
| 70.0 | 30.0 | 36.32 |

IV. Azeotrope or Azeotrope-Like Compositions of 1,2,2-trifluoro-1-trifluoromethylcyclobutane (TFMCB) and Ethanol It has been found that 1,2,2-trifluoro-1-trifluoromethylcyclobutane (TFMCB) forms homogeneous, minimum boiling azeotrope and azeotrope-like compositions or mixtures with ethanol, and the present disclosure provides homogeneous azeotrope or azeotrope-like compositions comprising 1,2,2-trifluoro-1-trifluoromethylcyclobutane and ethanol. The azeotrope or azeotrope-like compositions may consist essentially of 1,2,2-trifluoro-1-trifluoromethylcyclobutane and ethanol, or the azeotrope or azeotrope-like compositions may consist of 1,2,2-trifluoro-1-trifluoromethylcyclobutane and ethanol.

The present inventors have found experimentally that 1,2,2-trifluoro-1-trifluoromethylcyclobutane and ethanol form an azeotrope or azeotrope-like composition.

The present disclosure provides an azeotrope or azeotrope-like composition which comprises effective amounts of 1,2,2-trifluoro-1-trifluoromethylcyclobutane and ethanol to form an azeotrope or azeotrope-like composition. As used herein, the term "effective amount" is an amount of each component which, when combined with the other component, results in the formation of an azeotrope or azeotrope-like mixture.

The present azeotrope or azeotrope-like compositions may consist essentially of combinations of 1,2,2-trifluoro-1-trifluoromethylcyclobutane and ethanol, or consist of combinations of 1,2,2-trifluoro-1-trifluoromethylcyclobutane and ethanol.

The present disclosure also provides a method of forming an azeotrope or azeotrope-like composition by mixing, combining, or blending, effective amounts of, 1,2,2-trifluoro-1-trifluoromethylcyclobutane and ethanol. Any of a wide variety of methods known in the art for combining two or more components to form a composition can be used in the present methods. For example, 1,2,2-trifluoro-1-trifluoromethylcyclobutane and ethanol can be mixed, blended, or otherwise combined by hand and/or by machine, as part of a batch or continuous reaction and/or process, or via combinations of two or more such steps. Both 1,2,2-trifluoro-1-trifluoromethylcyclobutane and ethanol are commercially available and can be procured from several different vendors. The components can be provided in the required amounts, for example by weighing and then combining the amounts.

Preferably, the azeotrope or azeotrope-like composition comprises, consists essentially of, or consists of, from about 30 wt. % to about 98 wt. % 1,2,2-trifluoro-1-trifluoromethylcyclobutane, from about 70 wt. % to about 96 wt. % 1,2,2-trifluoro-1-trifluoromethylcyclobutane, from about 80 wt. % to about 90 wt. % 1,2,2-trifluoro-1-trifluoromethylcyclobutane, or about 88 wt. % 1,2,2-trifluoro-1-trifluoromethylcyclobutane, and from about 2 wt. % to about 70 wt. % ethanol, from about 4 wt. % to about 30 wt. % ethanol, from about 10 wt. % to about 20 wt. % ethanol, or about 12 wt. % ethanol. Preferably, the azeotrope or azeotrope-like composition of the present disclosure has a boiling point of about 66.61° C.±0.01° C. at a pressure of about 14.7 psia±0.2 psia.

In other words, the azeotrope or azeotrope-like composition may comprise from about 30 wt. % to about 98 wt. % 1,2,2-trifluoro-1-trifluoromethylcyclobutane and from about 70 wt. % to about 96 wt. % ethanol, or from about 80 wt. % to about 90 wt. % 1,2,2-trifluoro-1-trifluoromethylcyclobutane and from about 2 wt. % to about 70 wt. % ethanol, or from about 4 wt. % to about 30 wt. % 1,2,2-trifluoro-1-trifluoromethylcyclobutane and from about 10 wt. % to about 20 wt. % ethanol, or about 88 wt. % 1,2,2-trifluoro-1-trifluoromethylcyclobutane and about 12 wt. % ethanol. The azeotrope or azeotrope-like composition may consist essentially of 1,2,2-trifluoro-1-trifluoromethylcyclobutane and ethanol in the above amounts, or consist of 1,2,2-trifluoro-1-trifluoromethylcyclobutane and ethanol in the above amounts.

Preferably, the azeotrope or azeotrope-like composition has a boiling point of about 66.61° C.±0.01° C. at a pressure of about 14.7 psia±0.2 psia.

Stated alternatively, the azeotrope or azeotrope-like composition comprises, consists essentially of, or consists of, as little as about 30 wt. %, about 70 wt. % or about 80 wt. %, or as great as about 90 wt. %, about 96 wt. % or about 98 wt. % 1,2,2-trifluoro-1-trifluoromethylcyclobutane, or within any range defined between any two of the foregoing values, and the azeotrope or azeotrope-like composition comprises, consists essentially of, or consists of, as little as about 2 wt. %, about 4 wt. % or about 10 wt. %, or as great as about 20 wt. %, about 30 wt. % or about 70 wt. % ethanol, or within any range defined between any two of the foregoing values. In one embodiment, the azeotrope or azeotrope-like composition comprises, consists essentially of, or consists of, about 88 wt. % and 1,2,2-trifluoro-1-trifluoromethylcyclobutane and about 12 wt. % of ethanol. Preferably, the azeotrope or azeotrope-like composition of the present disclosure has a boiling point of about 66.61° C.±0.01° C. at a pressure of about 14.7 psia±0.2 psia.

The present disclosure also provides a composition comprising the azeotrope or azeotrope-like composition. For example, there is provided a composition comprising at least about 5 wt. % of the azeotrope or azeotrope-like composition, or at least about 15 wt. % of the azeotrope or azeotrope-like composition, or at least about 50 wt. % of the azeotrope or azeotrope-like composition, or at least about 70 wt. % of the azeotrope or azeotrope-like composition, or at least about 90 wt. % of the azeotrope or azeotrope-like composition.

The following non-limiting Example serves to illustrate the disclosure.

Example 3—Ebulliometer Study

The comparative ebulliometer described in Example 1 was used to measure the boiling point temperature of pure and mixed fluids at ambient pressure. Approximately 2-3 grams of a first fluid was charged into both the control and the measurement flasks and heated to reflux while stirring. When the temperature of the condensing fluid reached a constant value, the second fluid was added to the measurement flask in measured increments. Sufficient time delay was allowed between additions of the second fluid to achieve proper mixing of the two fluids and thermodynamic equilibration. The second fluid was not added to the control flask. Rather, the control flask was used to confirm constant pressure throughout the duration of the experiment by measuring an invariable boiling point for the pure first fluid.

The measurement was carried out by first introducing about 2 g of ethanol having a purity of >99 area % as determined by gas chromatography (GC) into the ebulliometer by weighing the container before and after the addition using a balance having an accuracy of ±0.01 g. The liquid was brought to a boil and the equilibrium temperature of the n-pentane was recorded at the recorded barometric pressure. Then, 1,2,2-trifluoro-1-trifluoromethylcyclobutane having a purity of >99.9 area % as determined by gas chromatography (GC) was introduced into the measurement flask in small, measured increments via an automated syringe pump. After a predetermined amount of 1,2,2-trifluoro-1-trifluoromethylcyclobutane was added to the measurement flask, the system was allowed to reach equilibrium for approximately five minutes before the equilibrium temperature of the condensing vapor-liquid mixture was recorded.

Figure 3:
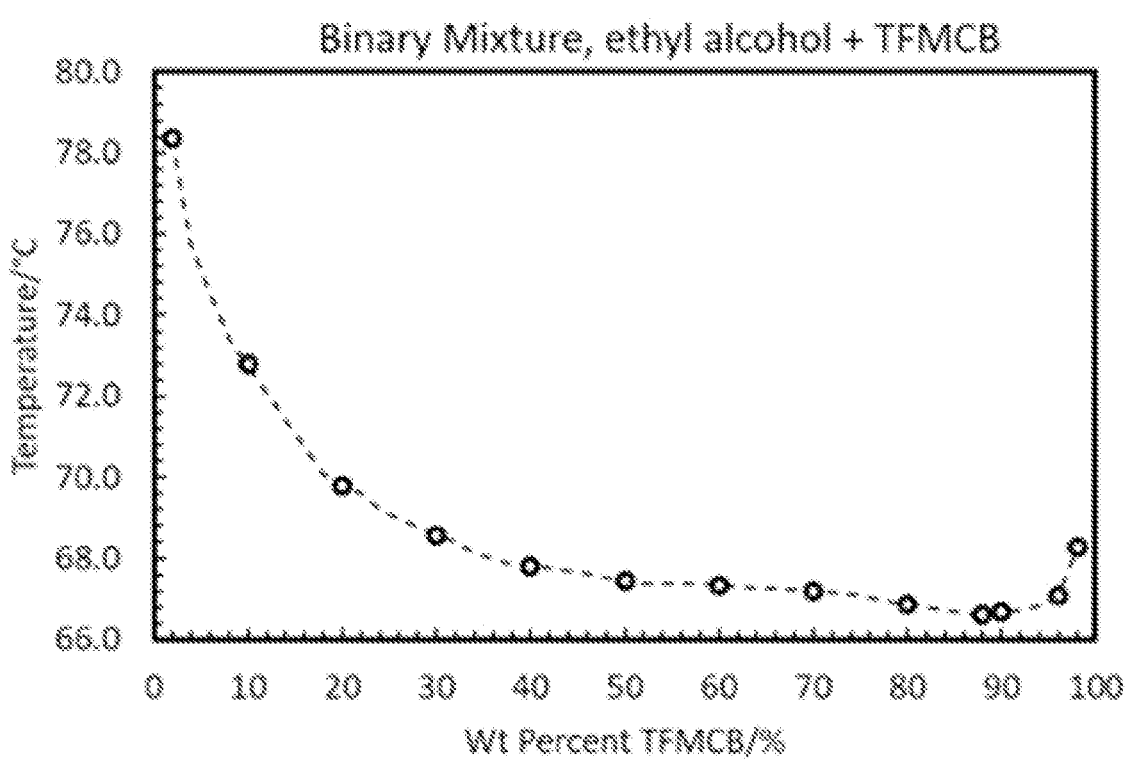
FIG. 3 illustrates the change in boiling point temperature of mixtures of ethanol and 1,2,2-trifluoro-1-trifluoromethyl cyclobutane at ambient pressure according to Example 3.

Composition versus boiling point data was obtained for the composition range from 2 to 98 weight percent of 1,2,2-trifluoro-1-trifluoromethylcyclobutane and is presented below in Table 3, which shows a minimum in temperature which indicates that an azeotrope had been formed, and this data is also presented in graphic form in FIG. 3. The bubble point temperature of the mixture remained constant indicating that the mixture was azeotrope-like over a large composition range.

A minimum boiling point temperature was observed at 88.0 wt. %±0.3 wt. % 1,2,2-trifluoro-1-trifluoromethylcyclobutane in the temperature versus weight percent 1,2,2-trifluoro-1-trifluoromethylcyclobutane curve (FIG. 3), indicating a minimum boiling azeotrope. Select temperature and composition data are shown in Table 3 below.

TABLE 3

Composition TFMCB/ethanol vs Boiling Point Temperature

| % wt. TFMCB | % wt. ethanol | Boiling Point Temperature, ° C. |
|---|---|---|
| 2.0 | 98.0 | 78.37 |
| 10.0 | 90.0 | 72.81 |
| 20.0 | 80.0 | 69.79 |
| 30.0 | 70.0 | 68.56 |
| 40.0 | 60.0 | 67.79 |
| 50.0 | 50.0 | 67.45 |
| 60.0 | 40.0 | 67.32 |
| 70.0 | 30.0 | 67.20 |
| 80.0 | 20.0 | 66.88 |
| 88.0 | 12.0 | 66.61 |
| 90.0 | 10.0 | 66.70 |
| 96.0 | 4.0 | 67.09 |
| 98.0 | 2.0 | 68.26 |

V. Azeotrope or Azeotrope-Like Compositions of 1,2,2-trifluoro-1-trifluoromethylcyclobutane (TFMCB) and cyclopentane It has been found that 1,2,2-trifluoro-1-trifluoromethylcyclobutane (TFMCB) forms homogeneous, minimum boiling azeotrope and azeotrope-like compositions or mixtures with cyclopentane, and the present disclosure provides homogeneous azeotrope or azeotrope-like compositions comprising 1,2,2-trifluoro-1-trifluoromethylcyclobutane and cyclopentane. The azeotrope or azeotrope-like compositions may consist essentially of 1,2,2-trifluoro-1-trifluoromethylcyclobutane and cyclopentane, or the azeotrope or azeotrope-like compositions may consist of 1,2,2-trifluoro-1-trifluoromethylcyclobutane and cyclopentane.

The present inventors have found experimentally that 1,2,2-trifluoro-1-trifluoromethylcyclobutane and cyclopentane form an azeotrope or azeotrope-like composition.

The present disclosure provides an azeotrope or azeotrope-like composition which comprises effective amounts of 1,2,2-trifluoro-1-trifluoromethylcyclobutane and cyclopentane to form an azeotrope or azeotrope-like composition. As used herein, the term "effective amount" is an amount of each component which, when combined with the other component, results in the formation of an azeotrope or azeotrope-like mixture.

The present azeotrope or azeotrope-like compositions may consist essentially of combinations of 1,2,2-trifluoro-1-trifluoromethylcyclobutane and cyclopentane, or consist of combinations of 1,2,2-trifluoro-1-trifluoromethylcyclobutane and cyclopentane.

The present disclosure also provides a method of forming an azeotrope or azeotrope-like composition by mixing, combining, or blending, effective amounts of, 1,2,2-trifluoro-1-trifluoromethylcyclobutane and cyclopentane. Any of a wide variety of methods known in the art for combining two or more components to form a composition can be used in the present methods. For example, 1,2,2-trifluoro-1-trifluoromethylcyclobutane and cyclopentane can be mixed, blended, or otherwise combined by hand and/or by machine, as part of a batch or continuous reaction and/or process, or via combinations of two or more such steps. Both 1,2,2-trifluoro-1-trifluoromethylcyclobutane and cyclopentane are commercially available and can be procured from several different vendors. The components can be provided in the required amounts, for example by weighing and then combining the amounts.

Preferably, the azeotrope or azeotrope-like composition comprises, consists essentially of, or consists of, from about 20 wt. % to about 60 wt. % 1,2,2-trifluoro-1-trifluoromethylcyclobutane, from about 30 wt. % to about 50 wt. % 1,2,2-trifluoro-1-trifluoromethylcyclobutane, from about 35 wt. % to about 40 wt. % 1,2,2-trifluoro-1-trifluoromethylcyclobutane, or about 39 wt. % 1,2,2-trifluoro-1-trifluoromethylcyclobutane, and from about 40 wt. % to about 80 wt. % cyclopentane, from about 50 wt. % to about 70 wt. % cyclopentane, from about 60 wt. % to about 65 wt. % cyclopentane, or about 61 wt. % cyclopentane. Preferably, the azeotrope or azeotrope-like composition of the present disclosure has a boiling point of about 45.59° C.±0.01° C. at a pressure of about 14.7 psia±0.2 psia.

In other words, the azeotrope or azeotrope-like composition may comprise from about 20 wt. % to about 60 wt. % 1,2,2-trifluoro-1-trifluoromethylcyclobutane and from about 40 wt. % to about 80 wt. % cyclopentane, or from about 30 wt. % to about 50 wt. % 1,2,2-trifluoro-1-trifluoromethylcyclobutane and from about 50 wt. % to about 70 wt. % cyclopentane, or from about 35 wt. % to about 40 wt. % 1,2,2-trifluoro-1-trifluoromethylcyclobutane and from about 60 wt. % to about 65 wt. % cyclopentane, or about 39 wt. % 1,2,2-trifluoro-1-trifluoromethylcyclobutane and about 61 wt. % cyclopentane. The azeotrope or azeotrope-like composition may consist essentially of 1,2,2-trifluoro-1-trifluoromethylcyclobutane and cyclopentane in the above amounts, or consist of 1,2,2-trifluoro-1-trifluoromethylcyclobutane and cyclopentane in the above amounts.

Preferably, the azeotrope or azeotrope-like composition has a boiling point of about 45.59° C.±0.01° C. at a pressure of about 14.7 psia±0.2 psia.

Stated alternatively, the azeotrope or azeotrope-like composition comprises, consists essentially of, or consists of, as little as about 20 wt. %, about 30 wt. % or about 35 wt. %, or as great as about 40 wt. %, about 50 wt. % or about 60 wt. % 1,2,2-trifluoro-1-trifluoromethylcyclobutane, or within any range defined between any two of the foregoing values, and the azeotrope or azeotrope-like composition comprises, consists essentially of, or consists of, as little as about 40 wt. %, about 50 wt. % or about 60 wt. %, or as great as about 65 wt. %, about 70 wt. % or about 80 wt. % cyclopentane, or within any range defined between any two of the foregoing values. In one embodiment, the azeotrope or azeotrope-like composition comprises, consists essentially of, or consists of, about 39 wt. % and 1,2,2-trifluoro-1-trifluoromethylcyclobutane and about 61 wt. % of cyclopentane. Preferably, the azeotrope or azeotrope-like composition of the present disclosure has a boiling point of about 45.59° C.±0.01° C. at a pressure of about 14.7 psia±0.2 psia.

The present disclosure also provides a composition comprising the azeotrope or azeotrope-like composition. For example, there is provided a composition comprising at least about 5 wt. % of the azeotrope or azeotrope-like composition, or at least about 15 wt. % of the azeotrope or azeotrope-like composition, or at least about 50 wt. % of the azeotrope or azeotrope-like composition, or at least about 70 wt. % of the azeotrope or azeotrope-like composition, or at least about 90 wt. % of the azeotrope or azeotrope-like composition.

The following non-limiting Example serves to illustrate the disclosure.

Example 4—Ebulliometer Study

The comparative ebulliometer described in Example 1 was used to measure the boiling point temperature of pure and mixed fluids at ambient pressure. Approximately 2-3 grams of a first fluid was charged into both the control and the measurement flasks and heated to reflux while stirring. When the temperature of the condensing fluid reached a constant value, the second fluid was added to the measurement flask in measured increments. Sufficient time delay was allowed between additions of the second fluid to achieve proper mixing of the two fluids and thermodynamic equilibration. The second fluid was not added to the control flask. Rather, the control flask was used to confirm constant pressure throughout the duration of the experiment by measuring an invariable boiling point for the pure first fluid.

The measurement was carried out by first introducing about 2 g of cyclopentane having a purity of >99 area % as determined by gas chromatography (GC) into the ebulliometer by weighing the container before and after the addition using a balance having an accuracy of ±0.01 g. The liquid was brought to a boil and the equilibrium temperature of the n-pentane was recorded at the recorded barometric pressure. Then, 1,2,2-trifluoro-1-trifluoromethylcyclobutane having a purity of >99.9 area % as determined by gas chromatography (GC) was introduced into the measurement flask in small, measured increments via an automated syringe pump. After a predetermined amount of 1,2,2-trifluoro-1-trifluoromethylcyclobutane was added to the measurement flask, the system was allowed to reach equilibrium for approximately five minutes before the equilibrium temperature of the condensing vapor-liquid mixture was recorded.

Figure 4:
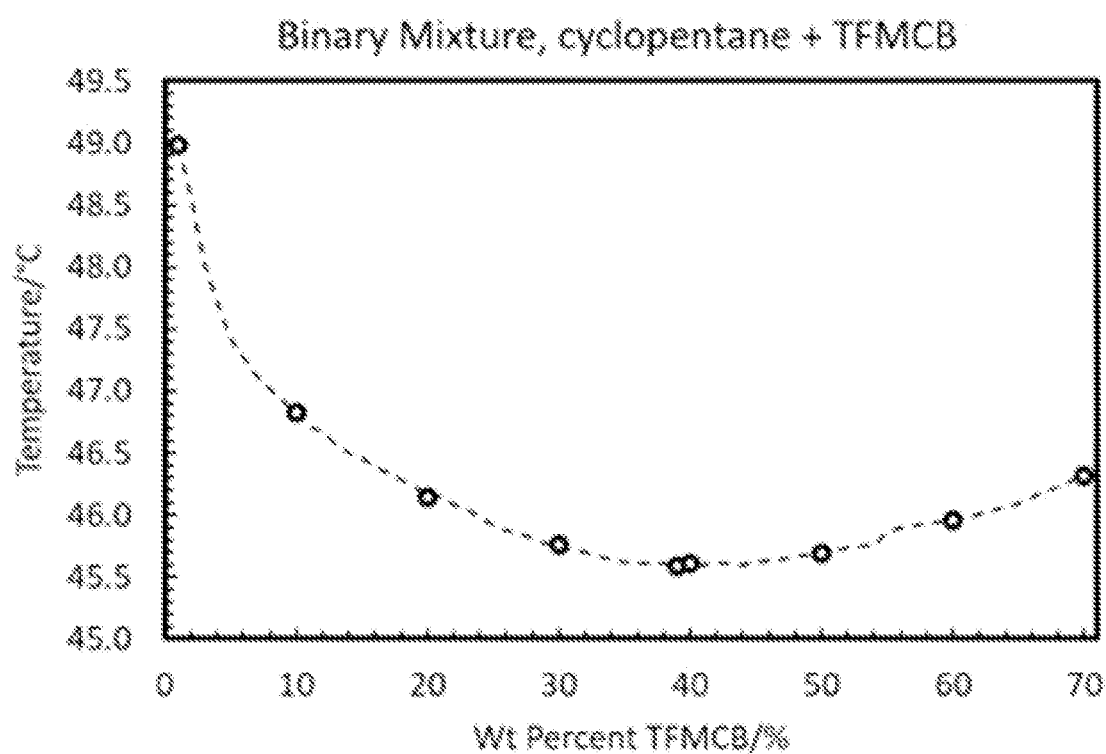
FIG. 4 illustrates the change in boiling point temperature of mixtures of cyclopentane and 1,2,2-trifluoro-1-trifluoromethyl cyclobutane at ambient pressure according to Example 4.

Composition versus boiling point data was obtained for the composition range from 1 to 70 weight percent of 1,2,2-trifluoro-1-trifluoromethylcyclobutane and is presented below in Table 4, which shows a minimum in temperature which indicates that an azeotrope had been formed, and this data is also presented in graphic form in FIG. 4. The bubble point temperature of the mixture remained constant indicating that the mixture was azeotrope-like over a large composition range.

A minimum boiling point temperature was observed at 39.0 wt. %±0.3 wt. % 1,2,2-trifluoro-1-trifluoromethylcyclobutane in the temperature versus weight percent 1,2,2-trifluoro-1-trifluoromethylcyclobutane curve (FIG. 4), indicating a minimum boiling azeotrope. Select temperature and composition data are shown in Table 4 below.

TABLE 4

Composition TFMCB/cyclopentane vs Boiling Point Temperature

| % wt. TFMCB | % wt. cyclopentane | Boiling Point Temperature, ° C. |
|---|---|---|
| 1.0 | 99.0 | 48.98 |
| 10.0 | 90.0 | 46.82 |
| 20.0 | 80.0 | 46.15 |
| 30.0 | 70.0 | 45.76 |
| 39.0 | 61.0 | 45.59 |
| 40.0 | 60.0 | 45.60 |
| 50.0 | 50.0 | 45.69 |
| 60.0 | 40.0 | 45.96 |
| 70.0 | 30.0 | 46.31 |

VI. Azeotrope or Azeotrope-Like Compositions of 1,2,2-trifluoro-1-trifluoromethylcyclobutane (TFMCB) and perfluoro(2-methyl-3-pentanone)

It has been found that 1,2,2-trifluoro-1-trifluoromethylcyclobutane (TFMCB) forms homogeneous, minimum boiling azeotrope and azeotrope-like compositions or mixtures with perfluoro(2-methyl-3-pentanone), and the present disclosure provides homogeneous azeotrope or azeotrope-like compositions comprising 1,2,2-trifluoro-1-trifluoromethylcyclobutane and perfluoro(2-methyl-3-pentanone). The azeotrope or azeotrope-like compositions may consist essentially of 1,2,2-trifluoro-1-trifluoromethylcyclobutane and perfluoro(2-methyl-3-pentanone), or the azeotrope or azeotrope-like compositions may consist of 1,2,2-trifluoro-1-trifluoromethylcyclobutane and perfluoro(2-methyl-3-pentanone).

The present inventors have found experimentally that 1,2,2-trifluoro-1-trifluoromethylcyclobutane and perfluoro(2-methyl-3-pentanone) form an azeotrope or azeotrope-like composition.

The present disclosure provides an azeotrope or azeotrope-like composition which comprises effective amounts of 1,2,2-trifluoro-1-trifluoromethylcyclobutane and perfluoro(2-methyl-3-pentanone) to form an azeotrope or azeotrope-like composition. As used herein, the term "effective amount" is an amount of each component which, when combined with the other component, results in the formation of an azeotrope or azeotrope-like mixture.

The present azeotrope or azeotrope-like compositions may consist essentially of combinations of 1,2,2-trifluoro-1-trifluoromethylcyclobutane and perfluoro(2-methyl-3-pentanone), or consist of combinations of 1,2,2-trifluoro-1-trifluoromethylcyclobutane and perfluoro(2-methyl-3-pentanone).

The present disclosure also provides a method of forming an azeotrope or azeotrope-like composition by mixing, combining, or blending, effective amounts of, 1,2,2-trifluoro-1-trifluoromethylcyclobutane and perfluoro(2-methyl-3-pentanone). Any of a wide variety of methods known in the art for combining two or more components to form a composition can be used in the present methods. For example, 1,2,2-trifluoro-1-trifluoromethylcyclobutane and perfluoro(2-methyl-3-pentanone) can be mixed, blended, or otherwise combined by hand and/or by machine, as part of a batch or continuous reaction and/or process, or via combinations of two or more such steps. Both 1,2,2-trifluoro-1-trifluoromethylcyclobutane and perfluoro(2-methyl-3-pentanone) are commercially available and can be procured from several different vendors. The components can be provided in the required amounts, for example by weighing and then combining the amounts.

Preferably, the azeotrope or azeotrope-like composition comprises, consists essentially of, or consists of, from about 1 wt. % to about 20 wt. % 1,2,2-trifluoro-1-trifluoromethylcyclobutane, from about 5 wt. % to about 15 wt. % 1,2,2-trifluoro-1-trifluoromethylcyclobutane, from about 8 wt. % to about 12 wt. % 1,2,2-trifluoro-1-trifluoromethylcyclobutane, or about 10 wt. % 1,2,2-trifluoro-1-trifluoromethylcyclobutane, and from about 80 wt. % to about 99 wt. % perfluoro(2-methyl-3-pentanone), from about 85 wt. % to about 95 wt. % perfluoro(2-methyl-3-pentanone), from about 88 wt. % to about 92 wt. % perfluoro(2-methyl-3-pentanone), or about 90 wt. % perfluoro(2-methyl-3-pentanone). Preferably, the azeotrope or azeotrope-like composition of the present disclosure has a boiling point of about 48.70° C.±0.01° C. at a pressure of about 14.7 psia±0.2 psia.

In other words, the azeotrope or azeotrope-like composition may comprise from about 1 wt. % to about 20 wt. % 1,2,2-trifluoro-1-trifluoromethylcyclobutane and from about 80 wt. % to about 99 wt. % perfluoro(2-methyl-3-pentanone), or from about 5 wt. % to about 15 wt. % 1,2,2-trifluoro-1-trifluoromethylcyclobutane and from about 85 wt. % to about 95 wt. % perfluoro(2-methyl-3-pentanone), or from about 8 wt. % to about 12 wt. % 1,2,2-trifluoro-1-trifluoromethylcyclobutane and from about 88 wt. % to about 92 wt. % perfluoro(2-methyl-3-pentanone), or about 10 wt. % 1,2,2-trifluoro-1-trifluoromethylcyclobutane and about 90 wt. % perfluoro(2-methyl-3-pentanone). The azeotrope or azeotrope-like composition may consist essentially of 1,2,2-trifluoro-1-trifluoromethylcyclobutane and perfluoro(2-methyl-3-pentanone) in the above amounts, or consist of 1,2,2-trifluoro-1-trifluoromethylcyclobutane and perfluoro(2-methyl-3-pentanone) in the above amounts.

Preferably, the azeotrope or azeotrope-like composition has a boiling point of about 48.70° C.±0.01° C. at a pressure of about 14.7 psia±0.2 psia.

Stated alternatively, the azeotrope or azeotrope-like composition comprises, consists essentially of, or consists of, as little as about 1 wt. %, about 5 wt. % or about 8 wt. %, or as great as about 12 wt. %, about 15 wt. % or about 20 wt. % 1,2,2-trifluoro-1-trifluoromethylcyclobutane, or within any range defined between any two of the foregoing values, and the azeotrope or azeotrope-like composition comprises, consists essentially of, or consists of, as little as about 80 wt. %, about 85 wt. % or about 88 wt. %, or as great as about 92 wt. %, about 95 wt. % or about 99 wt. % perfluoro(2-methyl-3-pentanone), or within any range defined between any two of the foregoing values. In one embodiment, the azeotrope or azeotrope-like composition comprises, consists essentially of, or consists of, about 10 wt. % and 1,2,2-trifluoro-1-trifluoromethylcyclobutane and about 90 wt. % of perfluoro(2-methyl-3-pentanone). The azeotrope or azeotrope-like composition of the present disclosure has a boiling point of about 48.70° C.±0.01° C. at a pressure of about 14.7 psia±0.2 psia.

The present disclosure also provides a composition comprising the azeotrope or azeotrope-like composition. For example, there is provided a composition comprising at least about 5 wt. % of the azeotrope or azeotrope-like composition, or at least about 15 wt. % of the azeotrope or azeotrope-like composition, or at least about 50 wt. % of the azeotrope or azeotrope-like composition, or at least about 70 wt. % of the azeotrope or azeotrope-like composition, or at least about 90 wt. % of the azeotrope or azeotrope-like composition.

The following non-limiting Example serves to illustrate the disclosure.

Example 5—Ebulliometer Study

The comparative ebulliometer described in Example 1 was used to measure the boiling point temperature of pure and mixed fluids at ambient pressure. Approximately 2-3 grams of a first fluid was charged into both the control and the measurement flasks and heated to reflux while stirring. When the temperature of the condensing fluid reached a constant value, the second fluid was added to the measurement flask in measured increments. Sufficient time delay was allowed between additions of the second fluid to achieve proper mixing of the two fluids and thermodynamic equilibration. The second fluid was not added to the control flask. Rather, the control flask was used to confirm constant pressure throughout the duration of the experiment by measuring an invariable boiling point for the pure first fluid.

The measurement was carried out by first introducing about 2 g of perfluoro(2-methyl-3-pentanone) having a purity of >99 area % as determined by gas chromatography (GC) into the ebulliometer by weighing the container before and after the addition using a balance having an accuracy of ±0.01 g. The liquid was brought to a boil and the equilibrium temperature of the n-pentane was recorded at the recorded barometric pressure. Then, 1,2,2-trifluoro-1-trifluoromethylcyclobutane having a purity of >99.9 area % as determined by gas chromatography (GC) was introduced into the measurement flask in small, measured increments via an automated syringe pump. After a predetermined amount of 1,2,2-trifluoro-1-trifluoromethylcyclobutane was added to the measurement flask, the system was allowed to reach equilibrium for approximately five minutes before the equilibrium temperature of the condensing vapor-liquid mixture was recorded.

Figure 5:
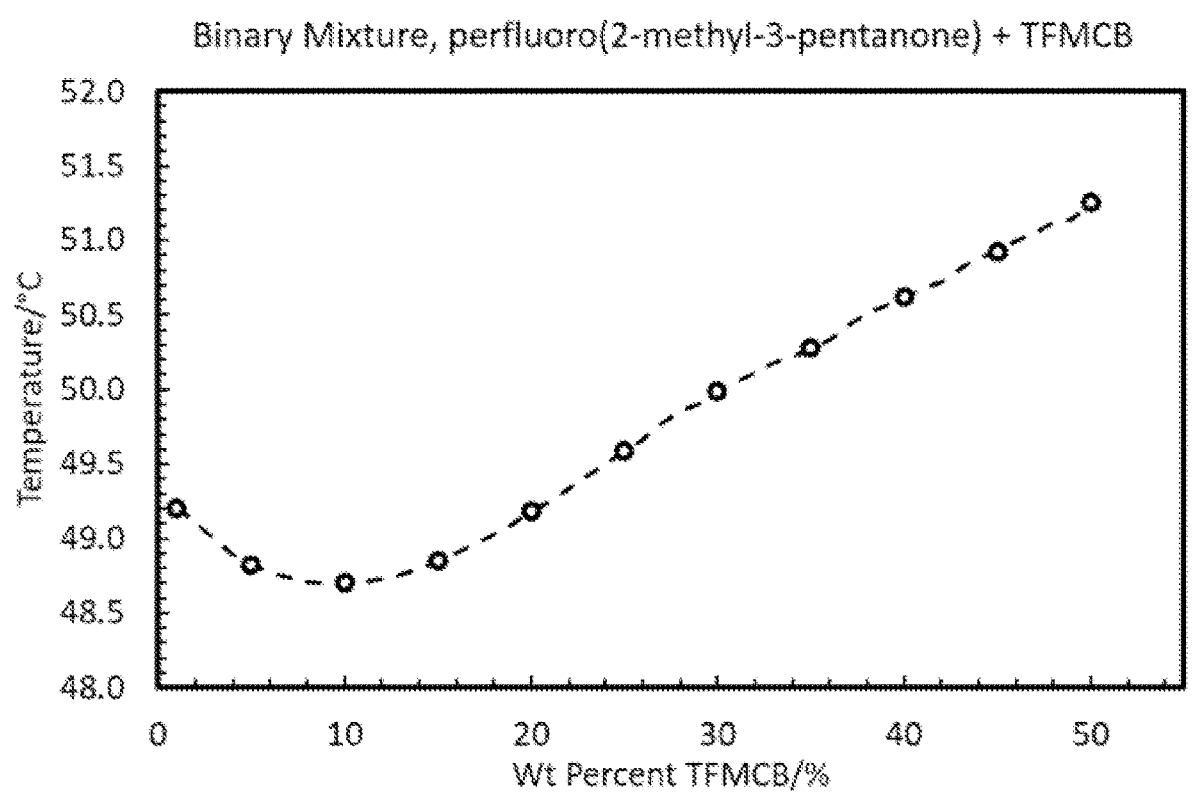
FIG. 5 illustrates the change in boiling point temperature of mixtures of perfluoro(2-methyl-3-pentanone) and 1,2,2-trifluoro-1-trifluoromethyl cyclobutane at ambient pressure according to Example 5.

Composition versus boiling point data was obtained for the composition range from 1 to 50 weight percent of 1,2,2-trifluoro-1-trifluoromethylcyclobutane and is presented below in Table 5, which shows a minimum in temperature which indicates that an azeotrope had been formed, and this data is also presented in graphic form in FIG. 5. The bubble point temperature of the mixture remained constant indicating that the mixture was azeotrope-like over a large composition range.

A minimum boiling point temperature was observed at 10.0 wt. %±0.3 wt. % 1,2,2-trifluoro-1-trifluoromethylcyclobutane in the temperature versus weight percent 1,2,2-trifluoro-1-trifluoromethylcyclobutane curve (FIG. 5), indicating a minimum boiling azeotrope. Select temperature and composition data are shown in Table 5 below.

TABLE 5

Composition TFMCB/perfluoro(2-methyl-3-pentanone) vs Boiling Point Temperature

| % wt. TFMCB | % wt. perfluoro (2-methyl-3-pentanone) | Boiling Point Temperature, ° C. |
|---|---|---|
| 1.0 | 99.0 | 49.20 |
| 5.0 | 95.0 | 48.82 |
| 10.0 | 90.0 | 48.70 |
| 15.0 | 85.0 | 48.85 |
| 20.0 | 80.0 | 49.18 |
| 25.0 | 75.0 | 49.59 |
| 30.0 | 70.0 | 49.99 |
| 35.0 | 65.0 | 50.28 |
| 40.0 | 60.0 | 50.61 |
| 45.0 | 55.0 | 50.92 |
| 50.0 | 50.0 | 51.25 |

VII. Heat Transfer Fluids

1. Introduction

The present invention provides a heat transfer fluid comprising an azeotrope or azeotrope-like composition as described herein.

The heat transfer fluid may specifically include azeotrope or azeotrope-like compositions comprising 1,2,2-trifluoro-1-trifluoromethylcyclobutane and perfluoro(2-methyl-3-pentanone).

When the heat transfer fluid is used in thermal management (e.g. in electronic cooling), it is referred to as a thermal management fluid. When the heat transfer fluid is used in a heat transfer system (e.g. a vapour compression heat transfer system), it is referred to as a refrigerant.

The heat transfer fluid may comprise the azeotrope or azeotrope-like composition in an amount of at least about 5% by weight, or at least about 15% by weight, or at least about 50% by weight, or at least about 70% by weight, or at least about 90% by weight or at least 95% by weight or at least 99% by weight or the heat transfer fluid may consist essentially of or consist of the azeotrope or azeotrope-like composition.

Preferably, the heat transfer fluid (and therefore also the thermal management fluid or refrigerant) has a low GWP. For example, the heat transfer fluid may have a GWP of not greater than about 1000, or not greater than about 700, or not greater than about 500, or not greater than about 300, or not greater than about 150.

The present invention also provides a heat transfer composition comprising a refrigerant of the invention.

The heat transfer composition may comprise at least about 5% by weight, or at least about 15% by weight, or at least about 50% by weight, or at least about 70% by weight, or at least about 90% by weight of the refrigerant.

The heat transfer composition may include other components for the purpose of enhancing or providing certain functionality to the composition.

Preferably, the heat transfer composition comprises a lubricant. The lubricant lubricates the refrigeration compressor using the refrigerant. The lubricant may be present in the heat transfer composition in amounts of from about 5% to about 30% by weight of heat transfer composition. Lubricants such as Polyol Esters (POEs), Poly Alkylene Glycols (PAGs), PAG oils, polyvinyl ethers (PVEs), and poly(alpha-olefin) (PAO) and combinations thereof may be used in the heat transfer compositions of the present invention.

Preferred lubricants include POEs and PVEs, more preferably POEs. Of course, different mixtures of different types of lubricants may be used. For example, the lubricant may be a PAG if the refrigerant is used in mobile air conditioning applications.

The heat transfer composition of the present invention may consist essentially of or consist of a refrigerant and lubricant as described above.

Commercially available mineral oils include Witco LP 250 (registered trademark) from Witco, Zerol 300 (registered trademark) from Shrieve Chemical, Sunisco 3GS from Witco, and Calumet R015 from Calumet. Commercially available alkyl benzene lubricants include Zerol 150 (registered trademark). Commercially available esters include neopentyl glycol dipelargonate, which is available as Emery 2917 (registered trademark) and Hatcol 2370 (registered trademark). Other useful esters include phosphate esters, dibasic acid esters, and fluoroesters.

The heat transfer composition may include a compatibilizer for the purpose of aiding compatibility and/or solubility of the lubricant. Suitable compatibilizers may include propane, butanes, pentanes, and/or hexanes. When present, the compatibilizer is preferably present in an amount of from about 0.5% to about 5% by weight of the heat transfer composition. Combinations of surfactants and solubilizing agents may also be added to the present compositions to aid oil solubility, as disclosed by U.S. Pat. No. 6,516,837, the disclosure of which is incorporated by reference.

2. Uses and Systems

The heat transfer fluid, thermal management fluid, refrigerant and heat transfer compositions of the invention may be used for heating and/or cooling.

Thus, the present invention provides a method of heating or cooling a fluid or body using a heat transfer fluid, thermal management fluid, refrigerant or heat transfer compositions of the invention of the invention.

Thermal Management

The heat transfer fluid may be used as a thermal management fluid.

In nearly every modern application of electronics, the dissipation of heat is an important consideration. For example, in portable and hand-held devices, the desire to miniaturize while adding functionality increases the thermal power density, which increases the challenge of cooling the electronics within them. As computational power increases within desktop computers, datacenters and telecommunications centers, so does the heat output. Power electronic devices such as the traction inverters in plug-in electric or hybrid vehicles, wind turbines, train engines, generators and various industrial processes make use of transistors that operate at ever higher currents and heat fluxes.

Therefore, the present invention relates to an electronic device comprising a thermal management fluid.

The thermal management fluid is designed to transfer heat from a heat-generating component in the electronic device to a heat exchanger (e.g. a condenser) in the electronic device. The thermal management fluid may be recirculated passively or actively, for example by using mechanical equipment such as a pump. Passive recirculating systems work by transferring heat from the heat-generating component to the thermal management fluid until it typically is vaporized, allowing the heated vapor to proceed to a condenser at which it can transfer its heat to the condenser surface and condense back into a liquid, and then allowing the condensed liquid to reflow into the thermal management fluid in contact with the heat-generating component. Passive thermal management systems can include, for example, single phase or two-phase immersion cooling. It will be appreciated that the thermal management fluid may be recirculated in a pumped two-phase system.

The thermal management fluid is typically used in a closed system in the electronic device, which may include at least two heat exchangers. When the thermal management fluid is used to cool the heat-generating component, heat can be transferred from the component to the fluid, usually through a heat exchanger in contact with at least a part of the component or the heat can be transferred to circulating air which can conduct the heat to a heat exchanger that is in thermal contact with the thermal management fluid. Alternatively, the fluid can contact the heat generating component directly. The fluid then, as a warmed fluid or as a vapor, can be circulated to a heat exchanger which takes the heat from the fluid and transfers it to the outside environment. After this heat transfer, the cooled thermal management fluid (cooled or condensed) is recycled.

The electronic device includes a heat-generating component. The heat-generating component can be any component that includes an electronic element that generates heat. Exemplary heat-generating components include semiconductor integrated circuits (ICs), electrochemical cells, power transistors, resistors, and electroluminescent elements. The heat generating component can include, but is not limited to microprocessors, wafers used to manufacture semiconductor devices, power control semiconductors, electrical distribution switch gear, power transformers, circuit boards, multi-chip modules, packaged or unpackaged semiconductor devices, semiconductor integrated circuits, fuel cells, lasers (conventional or laser diodes), light emitting diodes (LEDs), and electrochemical cells, e.g. used for high power applications such as, for example, hybrid or electric vehicles.

Suitable electronic devices include personal computers, microprocessors, servers, cell phones, tablets, digital home appliances (e.g. televisions, media players, games consoles etc.) and personal digital assistants. Datacenters, which are a collection of computer systems and associated components, such as telecommunications and storage systems that generally include redundant or backup power, redundant data communications connections, environmental controls (including, for example, air conditioning and fire suppression), and security devices, are also within the scope of the electronic devices of the invention. The electronic device may be a hybrid or electric vehicle. It will also be appreciated that the electric device may be a wind turbine, train engine, or generator.

Uses of Refrigerant and Heat Transfer Compositions

The invention also provides a heat transfer system comprising a refrigerant or a heat transfer composition of the invention. It will be appreciated that the heat transfer systems described herein may be vapour compression systems having an evaporator, a condenser and a compressor in fluid communication.

The refrigerant or heat transfer composition of the invention may be used as a secondary fluid.

It will be appreciated that the refrigerant or heat transfer composition of the invention may be used in a variety of different heat transfer applications.

Organic Rankine Cycle

The refrigerant or heat transfer composition of the invention may be used in an organic Rankine cycle (ORC). In the context of ORC, the refrigerant used in these systems may also be categorized as the "working fluid".

Rankine cycle systems are known to be a simple and reliable means to convert heat energy into mechanical shaft power.

In industrial settings, it may be possible to use flammable working fluids such as toluene and pentane, particularly when the industrial setting has large quantities of flammables already on site in processes or storage. However, for instances where the risk associated with use of a flammable and/or toxic working fluid is not acceptable, such as power generation in populous areas or near buildings, it is necessary to use non-flammable and/or non-toxic refrigerants as the working fluid. There is also a drive in the industry for these materials to be environmentally acceptable in terms of GWP.

The process for recovering waste heat in an Organic Rankine cycle involves pumping liquid-phase working fluid through a boiler where an external (waste) heat source, such as a process stream, heats the working fluid causing it to evaporate into a saturated or superheated vapor. This vapor is expanded through a turbine wherein the waste heat energy is converted into mechanical energy. Subsequently, the vapor phase working fluid is condensed to a liquid and pumped back to the boiler in order to repeat the heat extraction cycle.

Therefore, the invention relates to the use of a refrigerant or heat transfer composition of the invention in an Organic Rankine Cycle.

The invention also provides a process for converting thermal energy to mechanical energy in a Rankine cycle, the method comprising the steps of i) vaporizing a working fluid with a heat source and expanding the resulting vapor, then ii) cooling the working fluid with a heat sink to condense the vapor, wherein the working fluid is a refrigerant or heat transfer composition of the invention.

The mechanical work may be transmitted to an electrical device such as a generator to produce electrical power.

The heat source may be provided by a thermal energy source selected from industrial waste heat, solar energy, geothermal hot water, low pressure steam, distributed power generation equipment utilizing fuel cells, prime movers, or an internal combustion engine. The low pressure steam is a low pressure geothermal steam or is provided by a fossil fuel powered electrical generating power plant.

It will be appreciated that the heat source temperatures can vary widely, for example from about 90° C. to >800° C., and can be dependent upon a myriad of factors including geography, time of year, etc. for certain combustion gases and some fuel cells. Systems based on sources such as waste water or low pressure steam from, e.g., a plastics manufacturing plants and/or from chemical or other industrial plant, petroleum refinery, and the like, as well as geothermal sources, may have source temperatures that are at or below about 100° C., and in some cases as low as about 90° C. or even as low as about 80° C. Gaseous sources of heat such as exhaust gas from combustion process or from any heat source where subsequent treatments to remove particulates and/or corrosive species result in low temperatures may also have source temperatures that are at or below about 130° C., at or below about 120° C., at or below about 100° C., at or below about 100° C., and in some cases as low as about 90° C. or even as low as about 80° C.

However, it is preferred that the heat source has a temperature of at least about 200° C., for example of from about 200° C. to about 400° C.

Heat Pump

The refrigerant or heat transfer composition of the invention may be used in a heat pump system.

The present invention provides a method of heating a fluid or body using a heat pump, said method comprising the steps of (a) condensing a refrigerant composition of the invention in the vicinity of the fluid of body or be heated, and (b) evaporating said refrigerant.

Examples of heat pumps include heat pump tumble driers, reversible heat pumps, and air-to-air heat pumps. The heat pump may also be a heat pump water heater. It will be appreciated that the heat pump may be a high temperature heat pump. By "high temperature heat pump", it is meant a heat pump that is able to generate temperatures of at least about 80° C., preferably at least about 90° C., more preferably at least about 100° C.

It will be appreciated the heat pump may comprise a suction line/liquid line heat exchanger (SL-LL HX).

Secondary Loop System

The refrigerant or heat transfer compositions of the present invention may be used as secondary fluid in a secondary loop system.

A secondary loop system contains a primary vapor compression system loop that uses a primary refrigerant and whose evaporator cools the secondary loop fluid. The secondary fluid then provides the necessary cooling for an application. The secondary fluid must be non-flammable and have low-toxicity since the fluid in such a loop is potentially exposed to humans in the vicinity of the cooled space. In other words, the refrigerant or heat transfer composition of the present invention may be used as a "secondary fluid" in a secondary loop system.

The primary fluid used in the primary loop (vapor compression cycle, external/outdoors part of the loop) may be selected from but not limited to HFO-1234ze(E), HFO-1234yf, propane, R455A, R32, R466A, R44B, R290, R717, R452B, R448A, and R449A, preferably HFO-1234ze(E), HFO-1234yf, or propane.

The secondary loop system may be used in refrigeration or air conditioning applications.

In other words, the secondary loop system may be a secondary loop refrigeration system or a secondary loop air conditioning system.

Examples of where secondary loop refrigeration systems may be used include a low temperature refrigeration system, a medium temperature refrigeration system, a commercial refrigerator, a commercial freezer, an industrial freezer, an industrial refrigerator and a chiller.

Examples of where secondary loop air conditioning systems may be used include in mobile air conditioning systems. Mobile air-conditioning systems including air conditioning of road vehicles such as automobiles, trucks and buses, as well as air conditioning of boats, and trains. For example, where a vehicle contains a battery or electric power source. Alternatively, the secondary loop air conditioning system may be a stationary air conditioning system. Examples of stationary air conditioning systems include a chiller, particularly a positive displacement chiller, more particularly an air cooled or water cooled direct expansion chiller, which is either modular or conventionally singularly packaged, a residential air conditioning system, particularly a ducted split or a ductless split air conditioning system, a residential heat pump, a residential air to water heat pump/hydronic system, an industrial air conditioning system a commercial air conditioning system, particularly a packaged rooftop unit and a variable refrigerant flow (VRF) system; a commercial air source, water source or ground source heat pump system.

It will be appreciated the secondary loop air conditioning or refrigeration system may comprise a suction line/liquid line heat exchanger (SL-LL HX).

Methods

The heat transfer fluids, thermal management fluid, refrigerant or heat transfer compositions of the invention may be used as a for existing fluids.

For example, the thermal management fluid of the invention may be used as a replacement for existing fluids such as HFC-4310mee, HFE-7100 and HFE-7200. The replacement may be in existing systems, or in new systems.

For example, the refrigerants of the invention may be used as a replacement for existing refrigerants such as HFC-245fa, HFC-134a, HFC-404A and HFC-410A. The refrigerant may be used in applications in which the existing refrigerant was previously used. Alternatively, the refrigerant may be used to retrofit an existing refrigerant in an existing system.

The invention provides a method of replacing an existing refrigerant in a heat transfer system, said method comprising the steps of (a) removing at least a portion of said existing refrigerant from said system, and subsequently (b) introducing into said system a refrigerant of the invention. The existing refrigerants may be selected from HFC-245fa, HFC-134a, HFC-404A and HFC-410A.

Step (a) may involve removing at least about 5 wt %, at least about 10 wt %, at least about 15 wt %, at least about 50 wt % at least about 70 wt %, at least about 90 wt %, at least about 95 wt %, at least about 99 wt % or at least about 99.5 wt % of said existing refrigerant from said system prior to step (b).

The method may optionally comprise the step of flushing said system with a solvent after conducting step (a) and prior to conducting step (b).

Example 6—Heat Transfer Fluid for Electronics Components

Five different azeotropic compositions are prepared in accordance with Examples 1-5 above, respectively, including effective amounts of 1,2,2-trifluoro-1-trifluoromethylcyclobutane and each of ethanol, n-pentane, cyclopentane, trans-1,2-dichloroethylene, and perfluoro(2-methyl-3-pentanone) trans-1,2-dichloroethylene, respectively.

The compositions are used as heat transfer fluids in the form of refrigerants or working fluids in systems wherein the heat generating components are semiconductor integrated circuits (ICs), electrochemical cells, power transistors, resistors, and electroluminescent elements, such as microprocessors, wafers used to manufacture semiconductor devices, power control semiconductors, electrical distribution switch gear, power transformers, circuit boards, multi-chip modules, packaged or unpackaged semiconductor devices, semiconductor integrated circuits, fuel cells, lasers (conventional or laser diodes), light emitting diodes (LEDs), and electrochemical cells, e.g. used for high power applications such as, for example, hybrid or electric vehicles. The compositions demonstrate effective heat transfer properties.

In one specific use, an azeotrope or azeotrope-like composition consisting essentially of effective amounts of 1,2,2-trifluoro-1-trifluoromethylcyclobutane and perfluoro(2-methyl-3-pentanone) is prepared and demonstrates effective heat transfer properties in these applications.

Example 7—Heat Transfer Fluid for Electronics Components

Five different azeotropic compositions are prepared in accordance with Examples 1-5 above, respectively, including effective amounts of 1,2,2-trifluoro-1-trifluoromethylcyclobutane and each of ethanol, n-pentane, cyclopentane, trans-1,2-dichloroethylene, and perfluoro(2-methyl-3-pentanone) trans-1,2-dichloroethylene, respectively.

The compositions are used as heat transfer fluids in the form of refrigerants or working fluids in electronic devices including personal computers, microprocessors, servers, cell phones, tablets, digital home appliances (e.g. televisions, media players, games consoles etc.), personal digital assistants, Datacenters, hybrid or electric vehicles, wind turbine, train engine, or generator, preferably wherein the electronic device is a hybrid or electric vehicle. The compositions demonstrate effective heat transfer properties.

In one specific use, an azeotrope or azeotrope-like composition consisting essentially of effective amounts of 1,2,2-trifluoro-1-trifluoromethylcyclobutane and perfluoro(2-methyl-3-pentanone) is prepared and demonstrates effective heat transfer properties in these applications.

Example 8—Heat Transfer Fluids for ORCs

Five different azeotropic compositions are prepared in accordance with Examples 1-5 above, respectively, including effective amounts of 1,2,2-trifluoro-1-trifluoromethylcyclobutane and each of ethanol, n-pentane, cyclopentane, trans-1,2-dichloroethylene, and perfluoro(2-methyl-3-pentanone) trans-1,2-dichloroethylene, respectively.

The compositions are used as heat transfer fluids in the form of refrigerants or working fluids in a process for converting thermal energy to mechanical energy in an Organic Rankine Cycle (ORC), the method comprising the steps of i) vaporizing a working fluid with a heat source and expanding the resulting vapor, then ii) cooling the working fluid with a heat sink to condense the vapor. The compositions demonstrate effective heat transfer properties.

In one specific use, an azeotrope or azeotrope-like composition consisting essentially of effective amounts of 1,2,2-trifluoro-1-trifluoromethylcyclobutane and perfluoro(2-methyl-3-pentanone) is prepared and demonstrates effective heat transfer properties in this application.

Example 9—Heat Transfer Fluids for Heat Pumps

Five different azeotropic compositions are prepared in accordance with Examples 1-5 above, respectively, including effective amounts of 1,2,2-trifluoro-1-trifluoromethylcyclobutane and each of ethanol, n-pentane, cyclopentane, trans-1,2-dichloroethylene, and perfluoro(2-methyl-3-pentanone) trans-1,2-dichloroethylene, respectively.

The compositions are used as heat transfer fluids in the form of refrigerants or working fluids in a method of heating a fluid or body using a heat pump including the steps of (a) condensing a refrigerant in the vicinity of the fluid of body or be heated, and (b) evaporating said refrigerant. The compositions demonstrate effective heat transfer properties.

In one specific use, an azeotrope or azeotrope-like composition consisting essentially of effective amounts of 1,2,2-trifluoro-1-trifluoromethylcyclobutane and perfluoro(2-methyl-3-pentanone) is prepared and demonstrates effective heat transfer properties in this application.

Example 10—Heat Transfer Fluid for Secondary Loop Systems

Five different azeotropic compositions are prepared in accordance with Examples 1-5 above, respectively, including effective amounts of 1,2,2-trifluoro-1-trifluoromethylcyclobutane and each of ethanol, n-pentane, cyclopentane, trans-1,2-dichloroethylene, and perfluoro(2-methyl-3-pentanone) trans-1,2-dichloroethylene, respectively.

The compositions are used as heat transfer fluids in the form of refrigerants or working fluids in a primary vapor compression system loop that uses a primary refrigerant and whose evaporator cools a secondary loop fluid with the secondary refrigeration loop system selected from a low temperature refrigeration system, a medium temperature refrigeration system, a commercial refrigerator, a commercial freezer, an industrial freezer, an industrial refrigerator and a chiller. The compositions demonstrate effective heat transfer properties.

In one specific use, an azeotrope or azeotrope-like composition consisting essentially of effective amounts of 1,2,2-trifluoro-1-trifluoromethylcyclobutane and perfluoro(2-methyl-3-pentanone) is prepared and demonstrates effective heat transfer properties in this application.

VIII. Blowing Agents

The present azeotropic or azeotrope-like compositions may be used as blowing agents for thermosetting foams including polyurethane foam, a polyisocyanurate foam and a phenolic foam, and may also used as blowing agents for thermoplastic foams selected from a polyethylene foam, a polypropylene foam, a polystyrene foam and a polyethylene terephthalate foam.

In particular, an azeotropic or azeotrope-like composition including effective amounts of 1,2,2-trifluoro-1-trifluoromethylcyclobutane and cyclopentane may be used as a blowing agent for thermosetting foams selected from a polyurethane foam, a polyisocyanurate foam and a phenolic foam, and may also used as a blowing agent for thermoplastic foams selected from a polyethylene foam, a polypropylene foam, a polystyrene foam and a polyethylene terephthalate foam.

Example 11—Use of Azeotrope of 1,2,2-trifluoro-1-trifluoromethylcyclobutane and Cyclopentane as a Blowing Agent An azeotropic composition is prepared in accordance with Example 4 above, including effective amounts of 1,2,2-trifluoro-1-trifluoromethylcyclobutane and cyclopentane. The composition is used as a blowing agent for thermosetting foams selected from a polyurethane foam, a polyisocyanurate foam and a phenolic foam. The composition is also used as a blowing agent for thermoplastic foams selected from a polyethylene foam, a polypropylene foam, a polystyrene foam and a polyethylene terephthalate foam. The composition demonstrates use as a blowing agent in producing foams having effective thermal insulation.

IX. Solvents

The present azeotropic or azeotrope-like compositions, having components in the relative weight ranges disclosed herein, may be used as solvent compositions. The solvent compositions may be in the form of a sprayable aerosol compositions and may be used for applications including degreasing or removal of coatings such as paints and adhesives.

The solvent compositions may be an aerosol and/or a sprayable composition, and may have a Global Warming potential (GWP) of not greater than about 1000.

The solvent compositions may be used in methods of removing a contaminant from an article comprising contacting the contaminated article with the solvent composition. The article may be selected from the group consisting of a metal, a glass, silica, and alumina.

The solvent compositions may be used in methods of removing a coating from an article comprising contacting the contaminated article with the solvent composition. The coating may be selected from the group consisting of a paint and an adhesive.

Example 12

Solvent compositions including the present azeotropic or azeotrope-like compositions are loaded into aerosol cans. An aerosol valve is crimped into place on each can and HFC-134a is added through the valves to achieve a pressure in the cans of about 20 PSIG. The compositions are then sprayed onto surfaces demonstrating that the compositions are useful as an aerosol.

Additionally, the aerosol compositions are sprayed onto surfaces which include oil, grease, dirt, or solder flux, and are effective in solvating and removing such materials.

Example 13

Solvent compositions including the present azeotropic or azeotrope-like compositions are loaded into aerosol cans. Aerosol valves are crimped into place and HFC-134a is added through the valves to achieve a pressure in the cans of about 20 PSIG. The compositions are then sprayed onto metal coupons soiled with solder flux. The flux is removed and the coupons are visually clean.

Example 14

Example 13 above is repeated, except the method of applying the compositions as cleaning agents is vapor degreasing or wiping instead of spraying. Optionally, the cleaning agents are applied neat. Optionally, the materials to be cleaned are changed from solder fluxes to mineral oils, silicon oils, or other lubricants. Similar results are demonstrated in each case.

Example 15

Mixtures are prepared containing the present azeotropic or azeotrope-like compositions. Several stainless steel coupons are soiled with mineral oil. Then these coupons are immersed in the mixtures. The mixtures remove the oils in a short period of time. The coupons are observed visually and look clean.

Example 16

Aerosol solvents are prepared containing the present azeotropic or azeotrope-like compositions. Kester 1544 Rosin Soldering Flux is placed on stainless steel coupons and heated to approximately 300-400° F., which simulates contact with a wave soldier normally used to solder electronic components in the manufacture of printed circuit boards. The coupons are then sprayed with the solvents and removed after 15 seconds without rinsing. Results show that the coupons appeared clean by visual inspection.

Example 17

The present azeotropic or azeotrope-like compositions are used as solvating agents for removing paints, coatings and adhesives from surfaces. The solvating agents are effective for solvating the paints, coatings and adhesives and allowing the removal of same from the surfaces.

As used herein, the phrase "within any range defined between any two of the foregoing values" literally means that any range may be selected from any two of the values listed prior to such phrase regardless of whether the values are in the lower part of the listing or in the higher part of the listing. For example, a pair of values may be selected from two lower values, two higher values, or a lower value and a higher value.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variances that fall within the scope of the appended claims.

Aspects

The invention will now be illustrated by reference to the following numbered aspects. The subject matter of the numbered aspects may be additionally combined with subject matter from the description or from one or more of the claims.

Aspect 1 is an azeotrope or azeotrope-like composition consisting essentially of effective amounts of 1,2,2-trifluoro-1-trifluoromethylcyclobutane and trans-1,2-dichloroethylene.

Aspect 2 is the azeotrope or azeotrope-like composition of Aspect 1, consisting essentially of from about 1 wt. % to about 70 wt. % 1,2,2-trifluoro-1-trifluoromethylcyclobutane and from about 30 wt. % to about 99 wt. % trans-1,2-dichloroethylene.

Aspect 3 is the azeotrope or azeotrope-like composition of Aspect 2, consisting essentially of from about 10 wt. % to about 50 wt. % 1,2,2-trifluoro-1-trifluoromethylcyclobutane and from about 50 wt. % to about 90 wt. % trans-1,2-dichloroethylene.

Aspect 4 is the azeotrope or azeotrope-like composition of Aspect 3, consisting essentially of from about 15 wt. % to about 40 wt. % 1,2,2-trifluoro-1-trifluoromethylcyclobutane and from about 60 wt. % to about 85 wt. % trans-1,2-dichloroethylene.

Aspect 5 is the azeotrope or azeotrope-like composition of Aspect 4, consisting essentially of about 26 wt. % 1,2,2-trifluoro-1-trifluoromethylcyclobutane and about 74 wt. % trans-1,2-dichloroethylene.

Aspect 6 is the azeotrope or azeotrope-like composition of any of Aspects 1 to 5, wherein the composition has a boiling point of about 46.48° C.±0.01° C. at a pressure of about 14.7±0.2 psia.

Aspect 7 is the azeotrope or azeotrope-like composition of any of Aspects 1 to 6, consisting of 1,2,2-trifluoro-1-trifluoromethylcyclobutane and trans-1,2-dichloroethylene.

Aspect 8 is the azeotrope or azeotrope-like composition of any of Aspects 1 to 7, wherein the azeotrope or azeotrope-like composition lacks methanol.

Aspect 9 is a method of forming an azeotrope or azeotrope-like composition of any of aspects 1 to 8 comprising the step of combining 1,2,2-trifluoro-1-trifluoromethylcyclobutane and trans-1,2-dichloroethylene to form the azeotrope or azeotrope-like composition consisting essentially of effective amounts of 1,2,2-trifluoro-1-trifluoromethylcyclobutane and trans-1,2-dichloroethylene.

Aspect 10 is the method of Aspect 9, wherein the azeotrope or azeotrope-like composition lacks methanol.

Aspect 11 is an azeotrope or azeotrope-like composition consisting essentially of effective amounts of 1,2,2-trifluoro-1-trifluoromethylcyclobutane and n-pentane.

Aspect 12 is the azeotrope or azeotrope-like composition of Aspect 11, consisting essentially of from about 3 wt. % to about 50 wt. % 1,2,2-trifluoro-1-trifluoromethylcyclobutane and from about 50 wt. % to about 97 wt. % n-pentane.

Aspect 13 is the azeotrope or azeotrope-like composition of Aspect 12, consisting essentially of from about 8 wt. % to about 40 wt. % 1,2,2-trifluoro-1-trifluoromethylcyclobutane and from about 60 wt. % to about 92 wt. % n-pentane.

Aspect 14 is the azeotrope or azeotrope-like composition of Aspect 13, consisting essentially of from about 13 wt. % to about 30 wt. % 1,2,2-trifluoro-1-trifluoromethylcyclobutane and from about 70 wt. % to about 87 wt. % n-pentane.

Aspect 15 is the azeotrope or azeotrope-like composition of Aspect 14, consisting essentially of about 21 wt. % 1,2,2-trifluoro-1-trifluoromethylcyclobutane and from about 79 wt. % n-pentane.

Aspect 16 is the azeotrope or azeotrope-like composition of any of Aspects 11 to 15, wherein the composition has a boiling point of about 35.39° C.±0.01° C. at a pressure of about 14.6±0.2 psia.

Aspect 17 is the azeotrope or azeotrope-like composition of any of Aspects 11 to 16, consisting of 1,2,2-trifluoro-1-trifluoromethylcyclobutane and n-pentane.

Aspect 18 is a method of forming an azeotrope or azeotrope-like composition of any of aspects 11 to 17 comprising the step of combining 1,2,2-trifluoro-1-trifluoromethylcyclobutane and n-pentane to form the azeotrope or azeotrope-like composition consisting essentially of effective amounts of 1,2,2-trifluoro-1-trifluoromethylcyclobutane and n-pentane.

Aspect 19 is an azeotrope or azeotrope-like composition consisting essentially of effective amounts of 1,2,2-trifluoro-1-trifluoromethylcyclobutane and cyclopentane.

Aspect 20 is the azeotrope or azeotrope-like composition of Aspect 19, consisting essentially of from about 20 wt. % to about 60 wt. % 1,2,2-trifluoro-1-trifluoromethylcyclobutane and from about 40 wt. % to about 80 wt. % cyclopentane.

Aspect 21 is the azeotrope or azeotrope-like composition of Aspect 20, consisting essentially of from about 30 wt. % to about 50 wt. % 1,2,2-trifluoro-1-trifluoromethylcyclobutane and from about 50 wt. % to about 70 wt. % cyclopentane.

Aspect 22 is the azeotrope or azeotrope-like composition of Aspect 21, consisting essentially of from about 35 wt. % to about 40 wt. % 1,2,2-trifluoro-1-trifluoromethylcyclobutane and from about 60 wt. % to about 65 wt. % cyclopentane.

Aspect 23 is the azeotrope or azeotrope-like composition of Aspect 22, consisting essentially of about 39 wt. % 1,2,2-trifluoro-1-trifluoromethylcyclobutane and about 61 wt. % cyclopentane.

Aspect 24 is the azeotrope or azeotrope-like composition of any of Aspects 19 to 23, wherein the composition has a boiling point of about 45.59° C.±0.01° C. at a pressure of about 14.7±0.2 psia.

Aspect 25 is the azeotrope or azeotrope-like composition of any of Aspects 19 to 24, consisting of 1,2,2-trifluoro-1-trifluoromethylcyclobutane and cyclopentane.

Aspect 26 is a method of forming an azeotrope or azeotrope-like composition of any of aspects 19 to 25 comprising the step of combining 1,2,2-trifluoro-1-trifluoromethylcyclobutane and cyclopentane to form the azeotrope or azeotrope-like composition consisting essentially of effective amounts of 1,2,2-trifluoro-1-trifluoromethylcyclobutane and cyclopentane.

Aspect 27 is a blowing agent comprising an azeotrope or azeotrope-like composition of any of Aspects 19-26.

Aspect 28 is an azeotrope or azeotrope-like composition consisting essentially of effective amounts of 1,2,2-trifluoro-1-trifluoromethylcyclobutane and perfluoro(2-methyl-3-pentanone).

Aspect 29 is the azeotrope or azeotrope-like composition of Aspect 28, consisting essentially of from about 1 wt. % to about 20 wt. % 1,2,2-trifluoro-1-trifluoromethylcyclobutane and from about 80 wt. % to about 99 wt. % perfluoro(2-methyl-3-pentanone).

Aspect 30 is the azeotrope or azeotrope-like composition of Aspect 29, consisting essentially of from about 5 wt. % to about 15 wt. % 1,2,2-trifluoro-1-trifluoromethylcyclobutane and from about 85 wt. % to about 95 wt. % perfluoro(2-methyl-3-pentanone).

Aspect 31 is the azeotrope or azeotrope-like composition of Aspect 30, consisting essentially of from about 8 wt. % to about 12 wt. % 1,2,2-trifluoro-1-trifluoromethylcyclobutane and from about 88 wt. % to about 92 wt. % perfluoro(2-methyl-3-pentanone).

Aspect 32 is the azeotrope or azeotrope-like composition of Aspect 31, consisting essentially of about 10 wt. % 1,2,2-trifluoro-1-trifluoromethylcyclobutane and from about 90 wt. % perfluoro(2-methyl-3-pentanone).

Aspect 33 is the azeotrope or azeotrope-like composition of any of Aspects 28 to 32, wherein the composition has a boiling point of about 48.70° C.±0.01° C. at a pressure of about 14.7±0.2 psia.

Aspect 34 is the azeotrope or azeotrope-like composition of any of Aspects 28 to 32, consisting of 1,2,2-trifluoro-1-trifluoromethylcyclobutane and perfluoro(2-methyl-3-pentanone).

Aspect 34 is a method of forming an azeotrope or azeotrope-like composition of any of aspects 28 to 33 comprising the step of combining 1,2,2-trifluoro-1-trifluoromethylcyclobutane and perfluoro(2-methyl-3-pentanone) to form the azeotrope or azeotrope-like composition consisting essentially of effective amounts of 1,2,2-trifluoro-1-trifluoromethylcyclobutane and perfluoro(2-methyl-3-pentanone).

Aspect 35 is a method for cooling a heat generating component in an electronic device, the electronic device comprising a thermal management fluid comprising an azeotrope or azeotrope-like composition consisting essentially of effective amounts of 1,2,2-trifluoro-1-trifluoromethylcyclobutane and perfluoro(2-methyl-3-pentanone), the method comprising transferring heat from the heat-generating component to the thermal management fluid, and circulating said thermal management fluid in said system.

Aspect 36 is the method of Aspect 35, wherein the thermal management fluid is in direct contact with the heat generating component.

Aspect 37 is the method of Aspect 35 or Aspect 36, wherein the thermal management fluid consists essentially of an azeotrope or azeotrope-like composition consisting essentially of effective amounts of 1,2,2-trifluoro-1-trifluoromethylcyclobutane and perfluoro(2-methyl-3-pentanone).

Aspect 38 is the method of any of Aspects 35-37, wherein the heat generating component is selected from semiconductor integrated circuits (ICs), electrochemical cells, power transistors, resistors, and electroluminescent elements, such as microprocessors, wafers used to manufacture semiconductor devices, power control semiconductors, electrical distribution switch gear, power transformers, circuit boards, multi-chip modules, packaged or unpackaged semiconductor devices, semiconductor integrated circuits, fuel cells, lasers (conventional or laser diodes), light emitting diodes (LEDs), and electrochemical cells, e.g. used for high power applications such as, for example, hybrid or electric vehicles.

Aspect 39 is the method of any of Aspects 35-38, wherein said electronic device is selected from personal computers, microprocessors, servers, cell phones, tablets, digital home appliances (e.g. televisions, media players, games consoles etc.), personal digital assistants, Datacenters, hybrid or electric vehicles, wind turbine, train engine, or generator.

Aspect 40 is the method of Aspect 39, wherein the electronic device is a hybrid or electric vehicle.

Aspect 41 is a process for converting thermal energy to mechanical energy in a Rankine cycle, the method comprising the steps of i) vaporizing a working fluid with a heat source and expanding the resulting vapor, then ii) cooling the working fluid with a heat sink to condense the vapor, wherein the working fluid comprises at least about 50% by weight of an azeotrope or azeotrope-like composition consisting essentially of effective amounts of 1,2,2-trifluoro-1-trifluoromethylcyclobutane and perfluoro(2-methyl-3-pentanone).

Aspect 42 is a high temperature heat pump comprising a heat transfer fluid, wherein the heat transfer fluid comprises an azeotrope or azeotrope-like composition consisting essentially of effective amounts of 1,2,2-trifluoro-1-trifluoromethylcyclobutane and perfluoro(2-methyl-3-pentanone).

Aspect 43 is a secondary loop system comprising a refrigerant comprising an azeotrope or azeotrope-like composition consisting essentially of effective amounts of 1,2,2-trifluoro-1-trifluoromethylcyclobutane and perfluoro(2-methyl-3-pentanone).

Aspect 44 is a heat transfer composition comprising a heat transfer fluid and a lubricant, wherein the heat transfer fluid comprises an azeotrope or azeotrope-like composition consisting essentially of effective amounts of 1,2,2-trifluoro-1-trifluoromethylcyclobutane and perfluoro(2-methyl-3-pentanone).

Aspect 45 is the heat transfer fluid of Aspect 44, wherein the lubricant comprises at least one polyol ester (POE).

Aspect 46 is a method of replacing an existing refrigerant in a heat transfer system, the method comprising the steps of (a) removing at least a portion of said existing refrigerant from said system and subsequently (b) introducing into said system a refrigerant comprising an azeotrope or azeotrope-like composition consisting essentially of effective amounts of 1,2,2-trifluoro-1-trifluoromethylcyclobutane and perfluoro(2-methyl-3-pentanone).

Aspect 47 is a solvent composition comprising an azeotrope or azeotrope-like composition of any of Aspects 1-8, 11-17, 19-25 and 28-34.

Aspect 48 is an aerosol and/or a sprayable composition comprising the solvent composition of Aspect 47.

Aspect 49 is a method of removing a contaminant from an article comprising contacting the contaminated article with the solvent composition of Aspect 47 or Aspect 48.

Aspect 50 is the method of claim Aspect 49, wherein the article is selected from the group consisting of a metal, a glass, silica, and alumina.

Aspect 51 is a method of removing a coating from an article comprising contacting the contaminated article with the solvent composition of Aspect 47 or Aspect 48.

Aspect 52 is the method of Aspect 51, wherein the coating is selected from the group consisting of a paint and an adhesive.

Aspect 53 is the solvent composition of Aspect 47, wherein the solvent composition has a Global Warming potential (GWP) of not greater than about 1000.

As used herein, the phrase "within any range defined between any two of the foregoing values" literally means that any range may be selected from any two of the values listed prior to such phrase regardless of whether the values are in the lower part of the listing or in the higher part of the listing. For example, a pair of values may be selected from two lower values, two higher values, or a lower value and a higher value.

It should be understood that the foregoing description is only illustrative of the present disclosure. Various alternatives and modifications can be devised by those skilled in the art without departing from the disclosure. Accordingly, the present disclosure is intended to embrace all such alternatives, modifications and variances that fall within the scope of the appended claims.

The invention claimed is:

1. An azeotrope or azeotrope-like composition consisting essentially of effective amounts of 1,2,2-trifluoro-1-trifluoromethylcyclobutane and perfluoro(2-methyl-3-pentanone), wherein the azeotrope or azeotrope-like composition has a boiling point of about 48.70° C.±0.01° C. at a pressure of about 14.7 psia±0.2 psia.

2. The azeotrope or azeotrope-like composition of claim 1, wherein the azeotrope or azeotrope-like composition consists essentially of from about 1 wt. % to about 20 wt. % 1,2,2-trifluoro-1-trifluoromethylcyclobutane and from about 80 wt. % to about 99 wt. % perfluoro(2-methyl-3-pentanone).

3. The azeotrope or azeotrope-like composition of claim 1, wherein the azeotrope or azeotrope-like composition consists essentially of from about 5 wt. % to about 15 wt. % 1,2,2-trifluoro-1-trifluoromethylcyclobutane and from about 85 wt. % to about 95 wt. % perfluoro(2-methyl-3-pentanone).

4. The azeotrope or azeotrope-like composition of claim 1, wherein the azeotrope or azeotrope-like composition consists essentially of from about 8 wt. % to about 12 wt. % 1,2,2-trifluoro-1-trifluoromethylcyclobutane and from about 88 wt. % to about 92 wt. % perfluoro(2-methyl-3-pentanone).

5. The azeotrope or azeotrope-like composition of claim 1, wherein the azeotrope or azeotrope-like composition consists essentially of about 10 wt. % 1,2,2-trifluoro-1-trifluoromethylcyclobutane and about 90 wt. % perfluoro(2-methyl-3-pentanone).

6. An azeotrope or azeotrope-like composition consisting of 1,2,2-trifluoro-1-trifluoromethylcyclobutane and perfluoro(2-methyl-3-pentanone), wherein the azeotrope or azeotrope-like composition has a boiling point of about 48.70° C.±0.01° C. at a pressure of about 14.7 psia±0.2 psia.

7. The azeotrope or azeotrope-like composition of claim 1, wherein the azeotrope or azeotrope-like composition consists of from about 1 wt. % to about 20 wt. % 1,2,2-trifluoro-1-trifluoromethylcyclobutane and from about 80 wt. % to about 99 wt. % perfluoro(2-methyl-3-pentanone).

8. The azeotrope or azeotrope-like composition of claim 1, wherein the azeotrope or azeotrope-like composition consists of from about 5 wt. % to about 15 wt. % 1,2,2-trifluoro-1-trifluoromethylcyclobutane and from about 85 wt. % to about 95 wt. % perfluoro(2-methyl-3-pentanone).

9. The azeotrope or azeotrope-like composition of claim 1, wherein the azeotrope or azeotrope-like composition consists of from about 8 wt. % to about 12 wt. % 1,2,2-trifluoro-1-trifluoromethylcyclobutane and from about 88 wt. % to about 92 wt. % perfluoro(2-methyl-3-pentanone).

10. The azeotrope or azeotrope-like composition of claim 1, wherein the azeotrope or azeotrope-like composition consists of about 10 wt. % 1,2,2-trifluoro-1-trifluoromethylcyclobutane and about 90 wt. % perfluoro(2-methyl-3-pentanone).

* * * * *